US009581670B2

(12) United States Patent
Stemmer

(10) Patent No.: US 9,581,670 B2
(45) Date of Patent: Feb. 28, 2017

(54) METHOD AND CONTROL DEVICE FOR OPERATING A MAGNETIC RESONANCE SYSTEM

(71) Applicant: Alto Stemmer, Erlangen (DE)

(72) Inventor: Alto Stemmer, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 563 days.

(21) Appl. No.: 14/169,691

(22) Filed: Jan. 31, 2014

(65) Prior Publication Data

US 2014/0210471 A1    Jul. 31, 2014

(30) Foreign Application Priority Data

Jan. 31, 2013 (DE) .................. 10 2013 201 616

(51) Int. Cl.

| *G01R 33/565* | (2006.01) |
|---|---|
| *G01R 33/483* | (2006.01) |
| *G01R 33/561* | (2006.01) |
| G01R 33/48 | (2006.01) |
| G01R 33/563 | (2006.01) |

(52) U.S. Cl.
CPC ... *G01R 33/56554* (2013.01); *G01R 33/4835* (2013.01); *G01R 33/5617* (2013.01); *G01R 33/4824* (2013.01); *G01R 33/56341* (2013.01)

(58) Field of Classification Search
CPC ......... G01R 33/56554; G01R 33/4835; G01R 33/5617; G01R 33/4824; G01R 33/56341
See application file for complete search history.

(56) References Cited

U.S. PATENT DOCUMENTS

| 5,212,447 A | 5/1993 | Paltiel |
|---|---|---|
| 5,237,273 A * | 8/1993 | Plewes ............... G01R 33/4835 324/307 |
| 6,853,188 B2 | 2/2005 | Feinberg et al. |
| 7,840,049 B2 | 11/2010 | Stemmer |
| 2003/0169042 A1* | 9/2003 | Feinberg ............ G01R 33/4835 324/309 |

(Continued)

OTHER PUBLICATIONS

Li et al."3D turbo spin echo imaging technique: SPACE" Chinese J Magn Reson Imaging, vol. 1, No. 4, (2010).

(Continued)

*Primary Examiner* — Rodney Bonnette
(74) *Attorney, Agent, or Firm* — Schiff Hardin LLP

(57) ABSTRACT

In a magnetic resonance imaging procedure, multiple slices are initially spatially selectively excited in a first time interval by respective RF pulses followed by at least one RF refocusing pulse that causes one echo signal from each slice, with a time interval of two consecutive echo signals equal to the first time interval. A second RF refocusing pulse is emitted at a second time interval from the last echo signal that causes, one further echo signal per slice, with the time interval of two consecutive echo signals equal to the first time interval. At least one further RF refocusing pulse is emitted in a third time interval following the preceding RF refocusing pulse producing multiple temporally separated echo signals per refocusing pulse. The third time interval is selected so that the number of echo signals per RF refocusing pulse is twice the number of excited slices.

16 Claims, 8 Drawing Sheets

(56) References Cited

U.S. PATENT DOCUMENTS

| | | |
|---|---|---|
| 2005/0017719 A1 | 1/2005 | Heubes |
| 2005/0073304 A1* | 4/2005 | Feiweier .............. G01R 33/583 324/307 |
| 2005/0237057 A1 | 10/2005 | Porter |
| 2008/0009701 A1 | 1/2008 | Avram et al. |
| 2010/0060278 A1 | 3/2010 | Park |
| 2010/0259260 A1* | 10/2010 | Lee ....................... G01R 33/446 324/309 |
| 2010/0277169 A1 | 11/2010 | Feiweier |
| 2011/0241671 A1 | 10/2011 | Zhao et al. |
| 2012/0313640 A1 | 12/2012 | Pfeuffer |
| 2013/0249548 A1 | 9/2013 | Stemmer |

OTHER PUBLICATIONS

Kuang, et al. "A perception on the development of the virtual scan technology for the magnetic resonance imaging" Chinese J Magn Reson Imaging, vol. 2, No. 3, (2011).

Li et al."A Water-Fat Separation Magnetic Resonance Image Method Based on Inversion Recovery" Chinese of Magn Reson Imaging, vol. 29, No. 4, (2012).

Schick : "SPLICE: Sub-Second Duffusion Sensitive MR Imaging Using a Modified Fast Spin-Echo Acquistion" vol 38 pp. 638-644. (1997).

Günther et al.,"Simultaneous Spin-Echo Refocusing," Magnetic Resonance in Medicine vol. 54: pp. 513-523 2005.

Lee Kuan J., et al. "Multiplex RARE: A Simultaneous Multisclice Spin-Echo Sequence that Fulfils CPMG Conditions," Magnetic Resonance in Medicine vol. 64:pp. 299-305 (2010).

Scheenen et al. "MRI of the Human Prostate in Vivo at 7T," Abstract #592, Proc. Intl. Soc. Mag. Reson. Med. 19 (2011).

Oshio et al: "GRASE (Gradient-and Spin-Echo) Imaging: A Novel Fast MRI Technique", Magnetic Resonance in Medicine vol. 20, pp. 344-349 (1991).

Pipe, Motion Correction With Propeller MRI: Application to Head Motion and Free-Breathing Cardiac Imaging, Magnetic Resonance in Medicine, vol. 42, (1999) pp. 963-969.

Bernstein et al. "Handbook of MRI PUlse Sequences," (2004), pp. 784-789.

\* cited by examiner

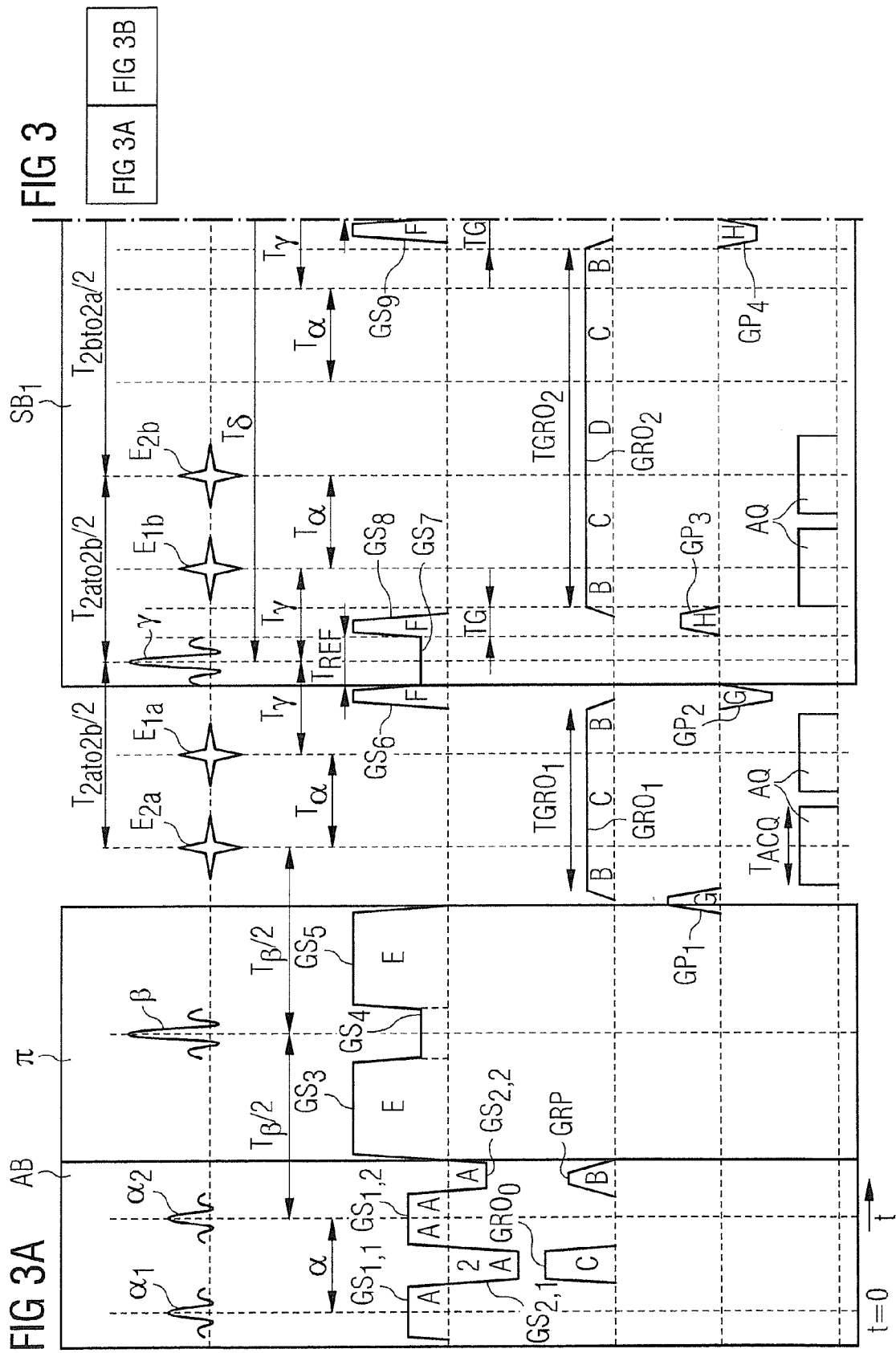

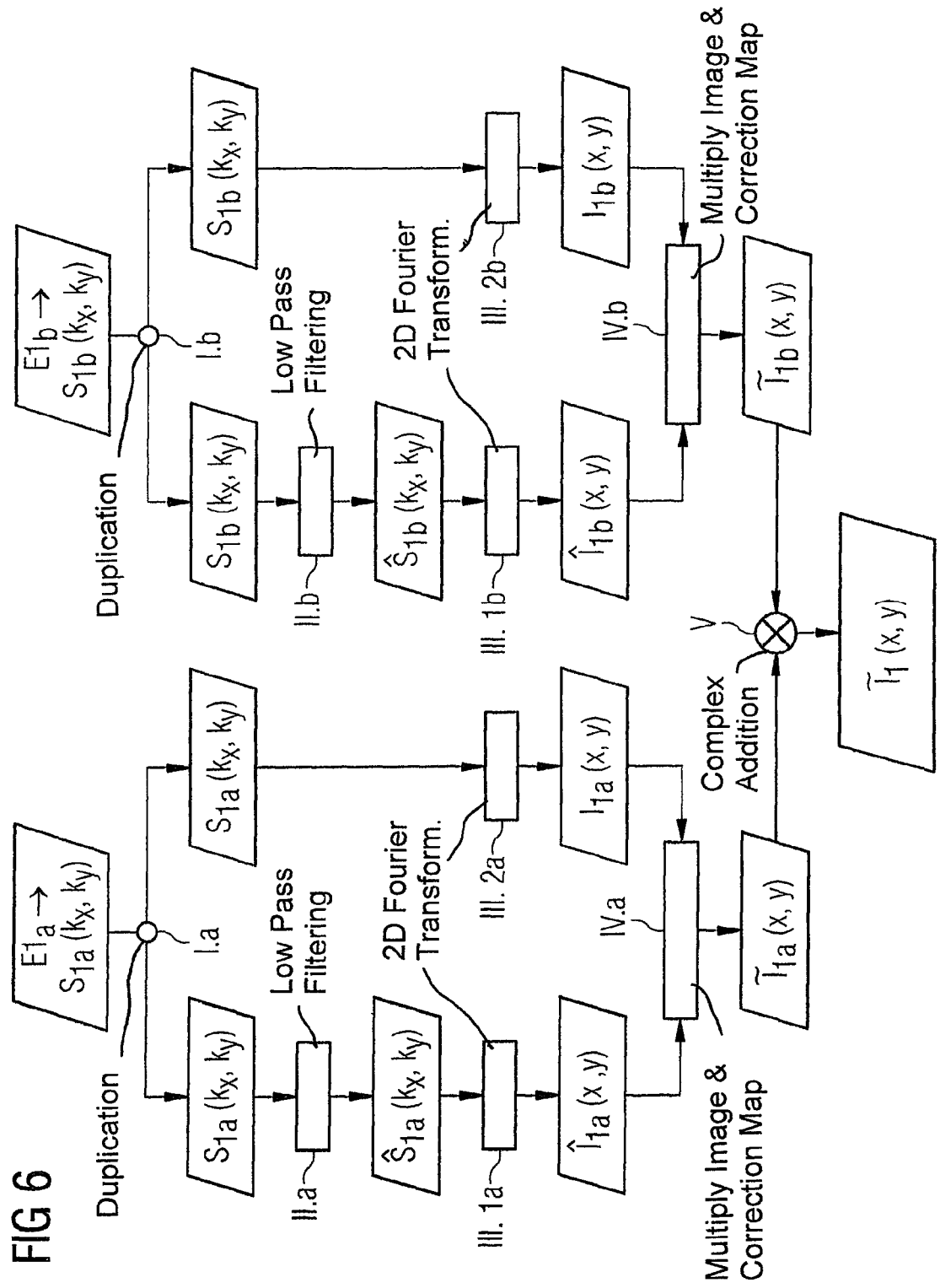

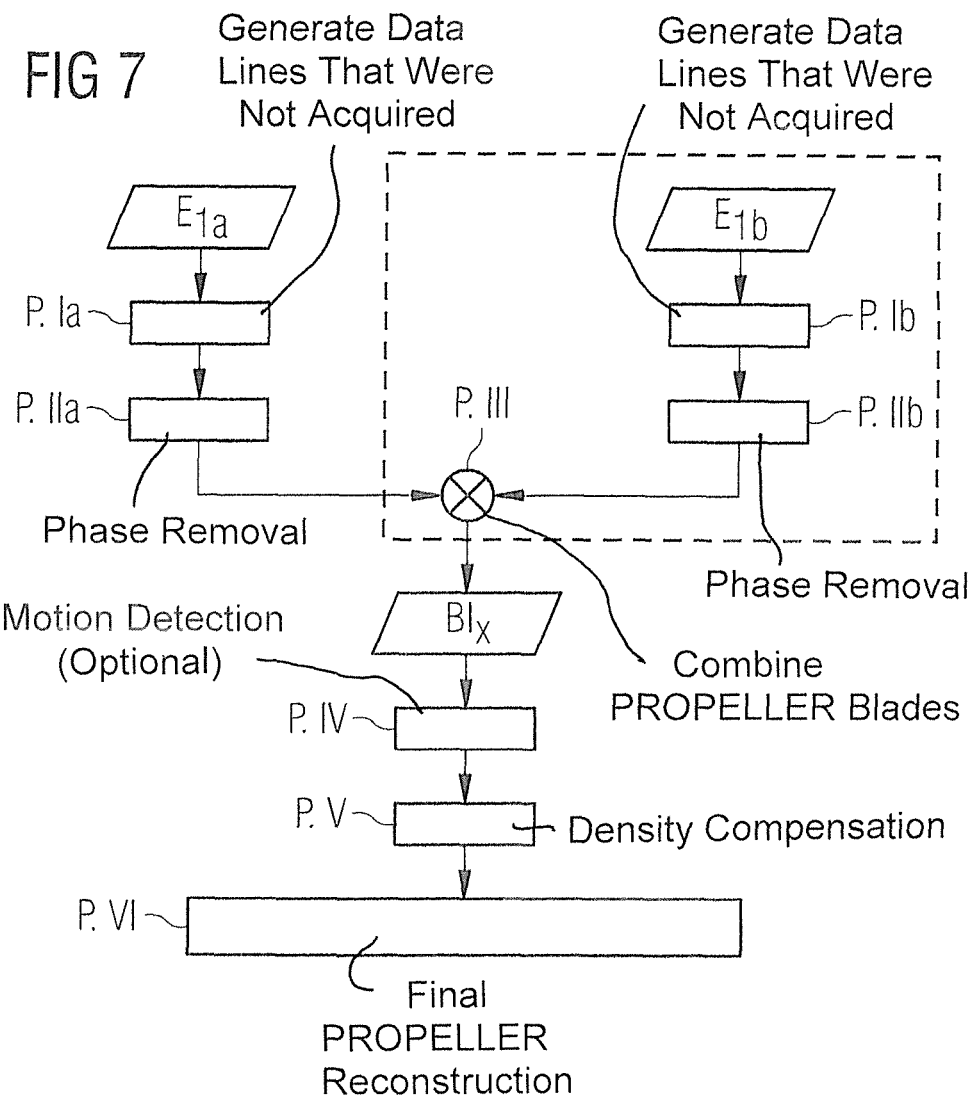

METHOD AND CONTROL DEVICE FOR OPERATING A MAGNETIC RESONANCE SYSTEM

BACKGROUND OF THE INVENTION

Field of the Invention

The invention concerns to a method for operating a magnetic resonance imaging (MRI) system in order to obtain magnetic resonance image data of an examination object, wherein, within a sequence module, number of slices in the examination object are excited by respective RF slice excitation pulses of a sequence of spatially selective RF slice excitation pulses, and then several RF refocusing pulses are emitted to produce, respectively, a number of temporally separate echo signals per RF refocusing pulse.

Furthermore, the invention concerns a method for producing magnetic resonance image data of an examination object, wherein raw data are used that are acquired by a magnetic resonance imaging system using such a method. In addition, the invention concerns a control device for a magnetic resonance imaging system for performing such a method, as well as a magnetic resonance imaging system having such a control device.

Description of the Prior Art

Usually, the body to be examined in a magnetic resonance system is exposed by means of a basic field magnet system to a relatively high basic magnetic field of, for example, 1.5 tesla, 3 tesla or 7 tesla. After applying the basic magnetic field, nuclei in the examination object align with a non-zero nuclear magnetic dipole moment, often also called spin, along the field. This collective response of the spin system is described as macroscopic magnetization. The macroscopic magnetization represents the vector sum of all microscopic magnetic moments in the object at a particular location. By means of a gradient system, it is possible to superimpose the basic field with a magnetic field gradient by means of which, among other things, the magnetic resonance frequency (Larmor frequency) is modified in the direction of the field gradient. Via a radio-frequency (RF) transmission system, radio-frequency excitation signals (RF pulses) are emitted by to be appropriate antenna setups, which cause the nuclear spins of specific nuclei to be resonantly excited by this radio-frequency field (i.e., by the Larmor frequency available at the respective location) to be tilted by a defined flip angle in relation to the magnetic field lines of the basic magnetic field. When such an RF pulse has an impact on already excited spins, these spins can be tipped to a different angular position or even folded back to an original position parallel to the basic magnetic field. During the relaxation period of the excited nuclear spins, radio-frequency signals, known as magnetic resonance signals are resonantly emitted and are received by appropriate receiving antennas and then processed further. Data representing the received signals are entered into a memory organized as k-space. k-space is the domain of spatial frequencies reciprocal to the image domain, transferred by the Fourier conjugate. During a measurement, k-space, for example corresponding to a slice, is temporally traversed along a gradient trajectory (also known as "k-space trajectory") defined by gradient pulses and, in the process, discrete k-space points are acquired as complex signals. In addition, the RF pulses have to be emitted in temporally compatible coordination. From the "raw data" thus acquired, the desired image data can be reconstructed, provided readout takes place in an adequately dense manner, such as by means of two-dimensional Fourier transformation. If the measured k-space points are not located on the corner points of a Cartesian grid, it is preferred to take further procedural steps prior to Fourier transformation, for example, to subject the measured data to an interpolation of the grid points.

Usually, during the measurement specifically pre-determined pulse frequencies are used for controlling the magnetic resonance imaging system. A pulse sequence is a sequence of defined RF pulses, as well as gradient pulses in different directions and scanning windows. A scanning window, in turn, is a time interval during which the receiving antennas are switched to reception mode and magnetic resonance signals are received and processed. By means of a measurement protocol, these sequences are parameterized in advance for a desired examination, for example, a specific contrast of the computed images. The measurement protocol can also include further control data for measurement (data acquisition). There are a large number of magnetic resonance sequence technologies that can be used to establish pulse frequencies.

In the clinical routine, fast sequence technologies are used, such as "turbo spin echo" sequences (TSE) or "fast spin echo" (FSE), or "echo planar imaging" (EPI), as well as so-called parallel acquisition technologies, so that it is possible to considerably reduce the measuring time for each measurement protocol.

TSE sequences use an RF excitation pulse, followed by a sequence of RF refocusing pulses. The spin echo being generated after each refocusing pulse is usually individually phase-encoded, making it possible to acquire several k-space lines per excitation and thus reduce the acquisition period compared to conventional spin echo sequences. At the same time, because of its relative insensitivity to off-resonance frequencies (i.e., a deviation from the Larmor frequency), which can occur, for example, as a result of system imperfections, magnetic susceptibility variations of the tissue, metallic implants, TSE technology or FSE technology is of great importance especially for the T2 contrast in clinical diagnostics. For special variations of these sequences, individual acronyms are used, such as "rapid acquisition with relaxation enhancement" (RARE), "half-Fourier acquired single-shot turbo spin echo" (HASTE), as well as "periodically rotated overlapping parallel lines with enhanced reconstruction" (PROPELLER) technology, which is explained below. Compared to EPI technologies, TSE technology is a relatively slow sequence technology and, because of the large number of refocusing pulses it is characterized by a high level of radio-frequency radiation into patients. The specific absorption rate (SAR), i.e., the radio-frequency energy absorbed at a specific time interval per kg body weight, is regulated. This results in the fact that the acquisition period of a TSE sequence, especially at field strengths starting at 3 tesla, is usually limited by the SAR and not by the performance capacity of the MR system (for example, the gradient system). In so-called ultra-high field systems with field strengths of 7T and more, the SAR exposure currently does not allow for performing an examination with a TSE sequence, with an adequate number of slices to cover the anatomy to be examined and in a clinically acceptable measuring time. The only way to accelerate such a sequence is to reduce the radio-frequency energy that has to be radiated for acquiring a specific data package. Therefore, a reduction of the SAR makes it possible to reduce the examination period and, consequently, also the costs of an MR examination.

Therefore, to achieve a further acceleration, it is attempted in a relatively new group of acceleration technologies (SMA—"simultaneous multi slice acquisition"), which has not yet been established in clinical practice, to excite several slices of a slice stack simultaneously (by means of so-called "wideband MRI") or in short succession (which is called "simultaneous echo refocusing"), and then to separate the signal emitted by the different slices as a result of this excitation in temporally (closely) consecutive scanning windows, or simultaneously receive and subsequently separate said signal with appropriate post processing methods.

In principle, it would be desirable, also in the context of TSE sequence technology in a sequence module, to excite several slices of a slice stack simultaneously or in short succession and repeatedly refocus them in simultaneous manner. However, due to the previously mentioned SAR problems, such new TSE sequence technology with a possibility of simultaneously acquiring several slices is only able to reduce the actual examination period if the radio-frequency radiation per time is at least not increasing. Because of this fact, a number of the new SMA technologies are per se practically irrelevant for TSE sequences.

A further problem in designing such new TSE sequences involves the fact that the refocusing pulses are usually not perfect 180-degree pulses. One of the reasons for this results from the fact that the flip angle for limiting the SAR has been reduced on purpose. Another inherent reason that is unavoidable involves the fact that because of the finite duration of the RF pulses the slice profile does not exactly have a rectangular shape and therefore deviates from the ideal 180 degrees, at least at the edges of the slices. Subsequently, the refocusing pulse only partially refocuses the transverse magnetization that is present, folds back a portion of the remaining non-focused magnetization in the longitudinal axis, and leaves the remaining portion unaffected. Correspondingly, the longitudinal (i.e., extending in the direction of the basic magnetic field) magnetization available prior to the refocusing pulse is partially "excited" by the refocusing pulse in the transverse plane, partially inverted and partially left unaffected. Then the transverse magnetization (i.e., the currently excited spins) available after the refocusing pulse accumulates a phase proportion as a result of the connected gradient fields and/or as a result of involuntarily available off resonances, while the longitudinal magnetization is unaffected by the connected gradient fields and is only subject to the relatively slow T1 decline until it is folded back in the transverse plane by one of the following refocusing pulses. Thus, each refocusing pulse acts only for a portion of the spin as refocusing pulse, for another portion it acts as excitation pulse, for a further portion as restore pulse (which folds back previously excited spins in the longitudinal direction, wherein the current phase position of the spin is maintained) and for the remaining portion it is transparent. Spins on which each refocusing pulse acts similarly follow a so-called coherent echo path. The number of different coherent echo paths increases exponentially with the number of refocusing pulses. Usually spins that followed different coherent echo paths contribute to a signal that is acquired in a scanning window starting with the second refocusing pulse. When these spins accumulate different phase proportions along the different coherent echo paths, it results in destructive interference. The signal collapses, the images calculated from the raw data show shadows and a poor signal to noise ratio (SNR), and the pulse frequency is not able to maintain a long echo train. The latter is a pre-requisite for the T2 contrast, which is especially important in the context of TSE imaging, and increase in efficiency, which can be achieved compared to a spin echo sequence.

To ensure that in each scanning window only those coherent echo paths contribute to the signal along which the spins accumulate the same phase proportions, the article "Simultaneous Spin-Echo Refocusing" in Magnetic Resonance in Medicine, 54, 2005, pp. 513-523 by M. Guenther and D. A. Feinberg, as well as in U.S. Pat. No. 8,853,188 B2, describes a TSE sequence in which m adjacent slices are excited at short time intervals and with a sequence of refocusing pulses respective echoes of m slices are refocused. At the same time, a specific pattern with spoiler gradient pulses prevents that echoes in which the signals are emitted by spins of different slices collapse unintentionally in a scanning window. Said spoiler pattern de-phases signals of such spins which follow specific coherent echo paths. By simultaneously refocusing the m slices, it is possible to reduce, approximately by a factor of m, the radiated radio-frequency power. However, by spoiling specific coherent echo paths the signal connected with these echo paths cannot be used for imaging, which results in a loss of SNR with respect to the separate acquisition of the slices. Moreover, unfortunately, with this pulse sequence it is not possible to maintain a long echo train (for example, with more than 20 echoes). Therefore, the pulse sequence cannot be used for T2-weighted imaging.

Therefore, DE 10 2012 204 434 specifies a turbo spin echo (TSE) sequence, subsequently called "mTSE sequence", which refocuses m adjacent slices simultaneously and, in the process, reduces the specific absorption rate (SAR) by approximately a factor of m with respect to a respective conventional TSE sequence. For one of the m slices, such a sequence fulfills the so-called Carr Purcell Meiboom Gill (CPMG) condition, which formulates design criteria on a TSE sequence which, in turn, result in a constructive superimposition of all coherent echo paths. As a result, mTSE cannot be used when the CPMG condition has been infringed, for example, because of a preparation block that has been inserted between an excitation pulse and the first refocusing pulse. In this context, a preparation pulse involves a sequence of radio-frequency pulses and/or gradient pulses (with at least one radio-frequency pulse or gradient pulse; however, in most cases several pulses) within a pulse sequence, in order to prepare specific regions of the examination object for subsequent data acquisition. For example, this serves the purpose of achieving a desired contrastor saturating in advance adipose tissue. An important example in this regard is the so-called diffusion-weighted imaging (DWI). Diffusion involves the Brownian motion of molecules in a medium. Diffusion-weighted imaging involves a method during which additional gradients are inserted in a pulse sequence as a preparation block in order to make visible or measure the diffusion properties of the tissue. These gradients cause tissue with faster diffusion (for example, cerebrospinal fluid (CSF)) to be subjected to more signal loss than tissue with slower diffusion (for example, the grey matter). The resulting diffusion contrast receives increasing clinical importance and, in the meantime, the applications far exceed the early detection of ischemic stroke. The clinically most important diffusion sequence is the diffusion-weighted single shot EPI sequence. Because of the short acquisition period for each image, the sequence is relatively insensitive to motion. However, the image quality suffers from typical artifacts, such as N/2 ghosting associated with EPI imaging (i.e., the calculated image is a superimposition of the real, selected anatomical image and a replica (the "ghost") of the real image, which is displaced in phase encoding direction by half a field of view) and geometric distortions in the environment of local field variations. TSE sequences, on the other hand, are considerably more insensitive to local field variations. However, the insertion of diffusion gradients in a TSE sequence results in an infringement of one of the CPMG conditions, which requires a specific phase relationship between the transverse magnetization at the time of $\tau/2$ prior to the refocusing pulse and the direction of the $B_1$ vector of the refocusing pulse. At the same time, $\tau$ is the so-called echo spacing, i.e., the time interval of consecutive refocusing pulses of the CPMG sequence. However, minimal macroscopic motion during diffusion preparation, for example, caused by vibration or the pulsation of the blood flow, already result in an incoherent phase of transverse magnetization and thus in an infringement of the CPMG condition.

SUMMARY OF THE INVENTION

An object of the present invention is to provide a method for operating a magnetic resonance imaging system that, among other things, is suitable for diffusion-weighted imaging, as well as a respective pulse sequence and control device for operating a magnetic resonance imaging system by means of which the above-mentioned problems are reduced or, preferably, completely eliminated.

In the method according to the invention, at least the following steps are performed within the scope of a sequence module:

First of all, a sequence of spatially selective RF slice excitation pulses is emitted in order to achieve an excitation of a plurality m (i.e., at least two) of usually adjacent slices in the examination object. In the process, one slice, respectively, is excited by an RF slice excitation pulse of this pulse sequence, wherein consecutive RF slice excitation pulses are respectively positioned at a first time interval to one another. Experts know that the spatial selectivity of the RF slice excitation pulses results from applying a parallel slice section gradient, i.e., from temporally appropriate parallel circuits of slice excitation gradient pulses. Subsequently, the terms "applying of gradients" and circuits of gradient pulses" are used synonymously.

According to the invention, a preparation block is performed directly or at a time interval following the last excitation pulse of the sequence of RF slice excitation pulses. Said preparation block comprises at least one RF refocusing pulse that is emitted. The preparation block is designed in such a way that for each of the slices one respective (i.e., exactly one) echo signal is formed, wherein the time interval of two consecutive echo signals is equal to the first time interval. In addition, said preparation block can comprise further radio-frequency pulses, particularly RF refocusing pulses, and/or gradient pulses, for example, to achieve the desired preparation. For example, for diffusion-weighted imaging the preparation block can have appropriate diffusion gradient pulses.

Then a second RF refocusing pulse is emitted at a second time interval from the last echo signal formed by the preparation block or its RF refocusing pulse, wherein the second RF refocusing pulse is designed in such a way that again for each of the slices exactly one further echo signal is formed, respectively, and the time interval of two consecutive echo signals is equal to the first time interval. In this context, the term "second RF refocusing pulse" always refers to the first refocusing pulse following the preparation block, regardless of whether the preparation block includes only one RF refocusing pulse or several refocusing pulses.

Moreover, in the sequence at least one further RF refocusing pulse is emitted at a respective third time interval following a respectively preceding RF refocusing pulse. This further RF refocusing pulse or each of the further RF refocusing pulses has the purpose of producing a number of temporally separated echo signals per RF refocusing pulse. At the same time, the third time interval has been selected in such a way that the number of echo signals per RF refocusing pulse is twice as high as the number of excited slices. Incidentally, the time intervals of adjoining echo signals of adjacent slices correspond again to the first time interval (i.e., the time interval between the excitation of slices).

The echo signals respectively formed after an RF refusing pulse (even the RF refocusing pulse or RF refocusing pulses in the preparation block and/or the RF refocusing pulse following the preparation block) can be read as raw data in the respectively separate scanning windows in order to reconstruct the image data. At the same time, all echo signals can be acquired and accepted in reconstruction, but not all echo signals have to be necessarily read.

Preferably, the spatial width of the RF refocusing pulses (also the RF refocusing pulse or RF refocusing pulses in the preparation block) for producing a plurality of temporally separated echo signals per RF refocusing pulse can be respectively selected in such a way that the RF refocusing pulses for simultaneously refocusing all excited slices comprise at least a portion of the excitation volume of all excited slices. In a preferred manner this applies to all RF refocusing pulses in the pulse sequence. As with the RF slice excitation pulses, the spatial width, i.e., the width of the slice, of the RF refocusing pulses can be adjusted by connecting in temporally compatible manner the appropriate gradient pulses in slice selection direction.

The invention-based pulse sequence for controlling a magnetic resonance imaging system in order to produce magnetic resonance image data of an examination object comprise at least one sequence module which includes at least the pulses or pulse sequences described above. Such a sequence module involves a closed portion of a pulse sequence which leads to an echo train with a specific number of echo signals. This means that a sequence module has an excitation portion with the radio-frequency pulses and gradient pulses emitted or applied during the initial excitation of all slices involved, as well as the subsequent echo train with the refocusing pulses, gradient pulses, echo signals and scanning windows. Accordingly, a pulse sequence has one or several such sequence modules per m slice.

Consequently, as with the mTSE pulse sequence described above, the invention provides a TSE pulse sequence by means of which m different slices are excited and then the signal emitted by these m slices can be simultaneously refocused, respectively, with a sequence of refocusing pulses, wherein the echo signals of the m slices produced after each of these refocusing pulses can be acquired in temporally separate scanning windows. This does not require that the slices excited by a specific echo train and simultaneously refocused have to be located directly adjacent to one another. For example, if it is not intended to excite further slices before the echo train is repeated, it is especially possible to use non-selective refocusing pulses. Furthermore, the sequence is also compatible with refocusing pulses which simultaneously refocus several slices that are not necessarily located adjacent to one another. Because of the fact that (as mentioned above) the latter provide a high SAR contribution, they are usually only considered for special applications of the sequence. However, in contrast to the wideband MRI mentioned above, there is also here the advantage that the signals of different slices do not have to be separated with post-processing methods.

In particular by means of the preferred simultaneous refocusing process the radio-frequency power accumulated by the refocusing pulses is reduced approximately by a factor m in comparison to the separate acquisition of m slices (with respective refocusing pulses and flip angles). As a result, it is possible to reduce approximately by a factor m compared to prior art the examination period of an SAR limited measurement at a particular resolution. Alternatively, it is possible, for example, to achieve a higher resolution at a particular examination period or to respectively multiply the total number of measured slices.

By means of the above-mentioned invention-based relative temporal spacing of excitation pulses and RF refocusing pulses, as well as switching of the gradient pulses, it is ensured that the echoes of different slices are formed at different times and can therefore be read in temporally separate scanning windows. Furthermore, by means of the temporal sequence of RF pulses and switching of the gradient fields, the signals of different echo paths of a slice are split in two groups in such a way that the echoes associated with different groups form in temporally separate manner and can be read in different scanning windows which do not coincide with the scanning windows of the other slices.

In contrast to the above-mentioned pulse sequence by Guenther and Feinberg, this measure can be used to relinquish spoiling specific coherent echo paths and thus use the signal linked with these echo paths for imaging. In particular, this prevents a destructive interference between signals of spins that follow different coherent echo paths, even during an extremely long echo train (with 15 and more refocusing pulses). As a result, the sequence is compatible with all current TSE contrasts—especially the particularly important T2 contrast.

In contrast to the above-mentioned mTSE sequence, the invention-based pulse sequence can be used even when the CPMG condition is infringed by a preparation module which has been inserted in the sequence, for example, to achieve the desired contrast. Therefore, one of the most important applications of the new sequence involves diffusion-weighted imaging. Similar to the well-known SPLICE sequence (SPLICE is an acronym for "split acquisition of fast spin-echo signals for diffusion imaging" and is described in the article "SPLICE: sub-second diffusion-sensitive MR imaging using a modified fast spin-echo acquisition mode" by Fritz Schick, published in the journal Magnetic Resonance in Medicine, volume 38, issue 4, pages 638-644, October 1997), the new sequence, a TSE-based technology, is insensitive to local $B_0$ field variations. However, at the same time, it alleviates the disadvantages of SPLICE technology, such as a long measurement period and high SAR. When simultaneous refocusing occurs, the SAR is reduced approximately by a factor m compared to a conventional SPLICE sequence, thus reducing the examination period of an SAR limited measurement. In comparison with a conventional SPLICE sequence, a further time-saving advantage consists of the fact that the preparation module is utilized only once after the m excitations. In a conventional, separately refocused SPLICE sequence, on the other hand, it has to be utilized once for each of the excitation.

A control device in accordance with the invention is designed so as to control the magnetic resonance imaging system during operation in order to produce magnetic resonance image data of an examination object by executing the pulse sequence in accordance with the invention described above.

A magnetic resonance imaging system according to the invention includes the following components:

a basic field magnet system for applying a homogenous basic magnetic field in a measuring volume in which the examination object is situated;

an RF antenna transmission system for transmitting the radio-frequency pulses to the examination object;

a gradient system for applying additional temporally limited gradient fields by switching gradient pulses in the manner described above;

an RF antenna reception system for acquiring the magnetic resonance signals from the examination object. Said RF antenna transmission system and the RF antenna reception system can involve different antenna systems or the same antenna system.

Furthermore, the magnetic resonance imaging system has a control device as described above that, during operation controls the imaging system in order to acquire magnetic resonance image data from an examination object. For example, for this purpose the control device can have different subcomponents, such as a radio-frequency transmission system for transmitting radio-frequency pulses to the RF antenna transmission system, a gradient system interface for controlling the gradient system, a radio-frequency reception device for generating the raw data from the signals received via the RF antenna reception system, as well as a sequence control device that transmits measuring sequence control data to the radio-frequency transmission system, the gradient system interface, the gradient system and the radio-frequency reception system for producing the magnetic resonance images during operation. These components, in the way described above, control the RF antenna transmission system, the gradient system, the radio-frequency reception system and the RF antenna reception system in the manner described above in order to acquire the raw data for a slice stack.

Preferably, important portions of the control device can be implemented in the form of software on an appropriate programmable control device with the respective storage capability. In particular, this applies to the sequence control device. At least to a certain extent, the radio-frequency transmission system, the gradient system interface and the radio-frequency reception system can also be implemented in the form of software units, wherein other units of these components can plainly involve hardware units, for example, the radio-frequency amplifier, the radio-frequency transmission system, a gradient pulse generation system of the gradient system interface or and analog to digital converter of the radio-frequency reception system. A largely software-based implementation, especially with respect to the sequence control unit, has the advantage that previously used magnetic resonance system control devices can easily be upgrade so as to be operable in accordance with the invention by means of a software update.

The invention also encompasses a non-transitory, computer-readable storage medium that can be loaded directly into a memory of a programmable control device. The storage medium is encoded with program instructions or commands for performing all steps of the inventive method when the program is run in the control device.

As described above, up to 2 m subsequent echo signals are produced per RF refocusing pulse with m simultaneously excited slices. After the preparation block and the following first RF refocusing pulse, exact m signals, respectively, occur initially, i.e., as many echo signals as slices were excited. 2 m echo signals occur after each subsequently following further RF refocusing pulse. Preferably, each of the echo signals occurring after an RF refocusing pulse is read in a number of separate scanning windows corresponding to the number of echoes under a readout gradient, i.e., under application of a gradient field in that a gradient pulse sequence with one or several gradient pulses is connected in readout direction.

In a preferred embodiment of the invention, already between two consecutive RF slice excitation pulses, respectively, a gradient pulse sequence is switched in a readout direction, the zero moment of which has an amount corresponding to the accumulated zero moment of a gradient pulse sequence that is later switched in readout direction between two consecutive echo signals of different slices. From a macroscopic as "seen" by the spins. The zero moment (subsequently also referred to simply as "moment") of a gradient pulse corresponds to the area below the pulse, i.e., the amplitude of the gradient integrated over time.

These gradient pulses located in readout direction between the RF slice excitation pulses with the appropriate moments cause the zero moment at the respectively different echo moments to always equal zero. As a result, it is possible, despite several excited slices and a split in different scanning windows, to set a readout gradient for spatial encoding and to acquire the respective echo signal not only in an integrative manner but also with spatial resolution.

It is preferred when the above-mentioned third time interval, i.e., the respective time interval between the further RF refocusing pulses, corresponds at least to the sum of the following time intervals:
the first time interval multiplied with the number of slices minus a first time interval.
twice the second time interval
the time period of a scanning window.

In other words, the third time interval $T_\delta$ is selected in such a way that it fulfills the condition $T_\delta=2\times(m-1)\times T_\alpha + 2\times T_\gamma + T_{ACQ}$, wherein m represents the number of slices, $T_\alpha$ the first time interval (i.e., the interval between the excitation of consecutive slices), $T_\gamma$ the second time interval (i.e., the interval formed by the echo signal between the RF refocusing pulse of the first refocusing block and the last preparation block) and $T_{ACQ}$, the period of a scanning window (or readout interval). In this way a complete (temporal) separation of adjacent scanning windows can be ensured with a minimal period of the third time interval.

Preferably, a further gradient is connected in slice selection direction between the slice selection gradients of two consecutive RF slice excitation pulses, which gradient ensures that the accumulated zero moment between the isodelay points of both RF slice excitation pulses is in slice selection direction zero. This means that the pulse sequence is designed in such a way that the accumulated zero moment of all gradient pulses which is switched in a slice selection direction between the isodelay points of two consecutive RF slice excitation pulses is also zero. The isodelay point of an RF slice excitation pulse is the period within the irradiation time of the excitation pulse at which the spins could be considered to be located in the transverse plane. For example, the period between the isodelay point of the RF excitation pulse and the end of the RF excitation pulse is used for calculating the moment of a slice refocusing gradient. The slice refocusing gradient has an opposite sign than the slice selection gradient. It is switched after the end of the RF radiation and has the purpose of compensating phase dispersion along the slice following the slice excitation gradient. In general, the isodelay point coincides with the peak of the RF pulse, that is, in the case of symmetric SING pulses, in good approximation with the center of the RF pulse.

Moreover, it is preferable that, during the sequence of RF slice excitation pulses (i.e., especially between the individual excitation pulses of the sequence of RF slice excitation pulses), and/or between the last excitation pulse and the preparation block, a gradient pulse sequence is interposed in readout direction that compensates for each slice a zero moment which is accumulated in readout direction by the respective slice between the start of the preparation block and the moment of any echo signal (which is directly refocused by the impact of the second RF refocusing pulse) of the respective slice formed by the impact of the preparation block. By means of an appropriate pulse sequence which has an appropriately selected pre-phase readout gradient pulses between the excitation pulses and/or the last excitation pulse and the preparation block it can be provided that for each individual slice the total moment in readout direction is balanced in such a way that it is zero exactly at the moment of the first echo signal of the respective slice, in consideration of the zero moment, which possibly accumulates in readout direction the total number of spins of the slice during the preparation block and then up until the desired gradient pulse.

Preferably, a gradient pulse sequence is activated in the readout direction between the last excitation pulse and the preparation block, which gradient pulse sequence exactly compensates the zero moment in readout direction which accumulates the spins of the last excited slice between the start of the preparation block and the first echo signal of said slice following the preparation block. At the same time, it is obvious that correspondingly no gradient pulse sequence is connected between the last excitation pulse and the preparation pulse, if no readout gradient for reading the m slices is switched after preparation block because, in this case, no compensation is required.

Furthermore, it is preferred to connect in readout direction a gradient pulse sequence between the last echo signal formed by the preparation block and the second RF refocusing pulse, which gradient pulse sequence exactly compensates in readout direction the zero moment which accumulates the spins of the first excited slice between the isodelay point of the second refocusing pulse and the first echo of the slice that is excited first after the second RF refocusing pulse.

In a preferred embodiment of the invention-based pulse sequence, the time period of an RF slice excitation pulse is shorter than the time period of an RF refocusing pulse. As described below, the higher the readout gradient selected the shorter the period of an excitation pulse. When increasing the readout gradient the k-space to be acquired in readout direction can be traversed within a very short time so that a relatively short echo spacing can be implemented despite the plurality of scanning windows per refocusing pulse. This can result in an improvement of image quality.

As described above, one of the most interesting applications of the inventive method involves diffusion-weighted imaging. Therefore, in a preferred model the preparation block is designed in such a way that it reduces transverse magnetization in the tissue area acquired by the preparation block, depending on the diffusion properties of the tissue. For example, for this purpose the preparation block can comprise in addition to the RF refocusing pulse appropriate preparation gradient pulses which, for example, are connected downstream and/or upstream of the actual slice selection gradient for the RF refocusing pulse. In particular, as described below, it is possible to connect two preparation gradient pulses in temporally symmetric manner about the RF refocusing pulse.

Depending on the exact embodiment of the pulse sequence, there are different possibilities of acquiring the raw data in the k-space required for the image reconstruction of a slice.

In a first alternative, the respective k-spaces of the slices to be scanned are acquired twice in a single echo train of a sequence module. This means that all raw data respectively required for each individual slice are completely acquired in a single sequence module of the pulse sequence.

In a second alternative, one k-space in the individual slices to be scanned is acquired in a pulse sequence with a number of sequence modules, wherein, based on the echo signals, raw data of one or two segments per slice are acquired with each sequence module, i.e., with each echo train.

For example, segmentation of the k-space can be performed according to a PROPELLER trajectory. Preferably, raw data of one or two Cartesian (i.e., the readout points of each propeller blade are located on the grid points of a Cartesian grid) k-space segments per slice are acquired with each echo train, which each include the k-space center.

Preferably, in the invention-based method, the respective raw data required for image reconstruction in the different slices are acquired separately several times in different scanning windows. Different invention-based methods are available for producing magnetic resonance image data based on such raw data which have been acquired several times in different scanning windows within the scope of a sequence module using an invention-based method.

In a first variation, separate magnitude images are first calculated for the raw data from the different scanning windows. Then, the magnitude images assigned to the same slice are combined to a single tomographic image of this slice in order to improve the signal-to-noise ratio. Preferably, the combination of the magnitude images of the same slice is performed by means of a sum of the squares method.

In a second variation, a complex-valued combination of image data is performed in a specific slice the raw data of which has been acquired in different scanning windows, preferably with a single echo train. Preferably, said complex-valued combination is performed after the spatially slowly varying phase in the image space has been computationally removed. Alternatively, instead of computationally eliminating the spatially slowly varying phase in the image space, it is also possible to use a different computational method which prevents the destructive interference of the signals from different scanning windows. At the same time, the complex-valued combination of image data of a specific slice can be especially performed in segments.

This special reconstruction of image data based on raw data can be performed directly in a reconstruction device of the magnetic resonance imaging system, for example, in its control device. However, in principle, such reconstruction can be performed on a different computer. It is only required that raw data be provided thereto, for example, via an interface to a network to which the magnetic resonance imaging system is also connected.

BRIEF DESCRIPTION OF THE DRAWINGS

FIG. 3 shows the combination of FIGS. 3A and 3B.

FIGS. 3A and 3B show a pulse pattern for a multi-slice TSE pulse sequence according to one embodiment of the invention having two simultaneously refocused slices.

FIG. 6 is a flowchart of an example of a sequence of a method for a complex combination of the raw data acquired in the different scanning windows.

FIG. 7 is a flowchart for a sequence of a method for combining the raw data acquired in the different scanning windows from a PROPELLER TSE sequence designed according to an inventive pulse pattern.

DESCRIPTION OF THE PREFERRED EMBODIMENTS

Figure 1:
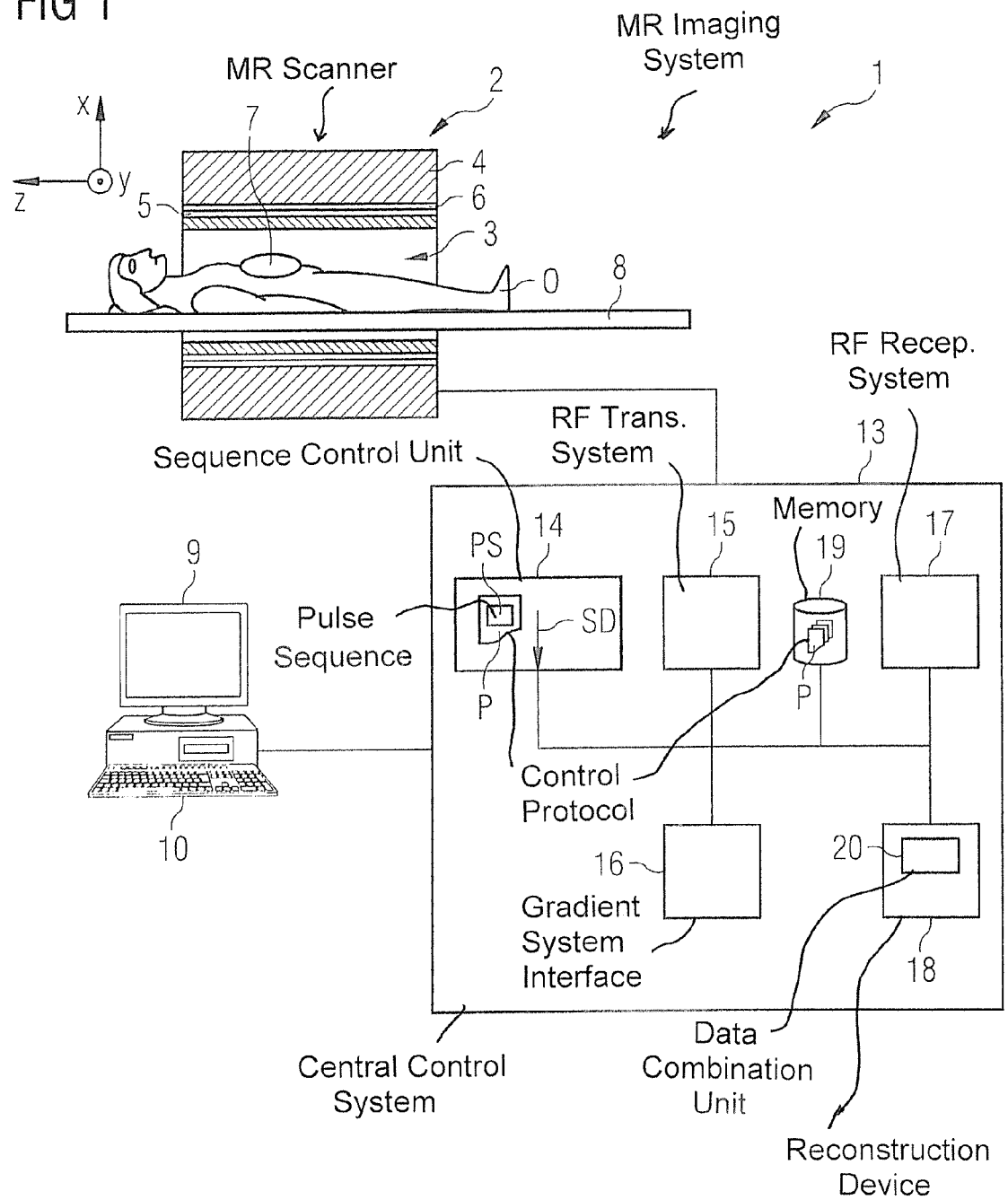
FIG. 1 is a schematic representation of a magnetic resonance imaging system according to one embodiment of the invention.

FIG. 1 shows an approximate invention-based magnetic resonance imaging system 1 (subsequently also called "MR system"). On the one hand, it comprises the actual magnetic resonance scanner 2 with an examination room 3 or tunnel, into which it is possible to insert an examination object O, or in this case a patient or test person in whose body the examination object, for example a specific organ, is located.

In conventional manner, the magnetic resonance scanner 2 is equipped with a basic field magnet system 4, a gradient system 6, as well as an RF antenna transmission system 5 and an RF antenna reception system 7. In the embodiment shown, the RF antenna transmission system 5 is a whole body coil permanently installed in the magnetic resonance scanner 2, while the RF antenna reception system 7 is composed of local coils that can be arranged on the patient or test person (symbolized in FIG. 1 only by a single local coil). Basically, it is also possible to use the whole body coil as RF antenna reception system and the local coils as RF antenna transmission system, provided these coils can be switched to different operational modes. Here the basic field magnet system 4 is designed in conventional manner in such a way that it produces a basic magnet field in longitudinal direction of the patient, i.e., along the longitudinal axis of the magnetic resonance scanner 2, which axis extends in z direction. In conventional manner, the gradient system 6 has individually controllable gradient coils in order to connect independently from one another gradients in x, y or z direction.

The MR system shown in FIG. 1 involves a whole body system with a tunnel into which a patient can be completely inserted. Basically, it is also possible to use the invention on other MR systems, for example, with laterally open, C-shaped housings, particularly with smaller magnetic resonance scanners, in which, for example, only 1 body part can be positioned.

Furthermore, the MR system 1 has a central control device 13 used for controlling the system. This central control system 13 has a sequence control unit 14 for performing measuring sequence control. It is used to control within a measuring session the sequence of radio-frequency pulses (RF pulses) and gradient pulses depending on a selected pulse sequence PS in a test person's volume range of interest. At the same time, several sequence modules can be used to build a pulse sequence. Each sequence module acquires data from one and/or several slices. For example, such a pulse sequence PS can be predetermined and parameterized within a measurement or control protocol P. Usually, different control protocols P are stored in a memory 19 for different measurements or measuring sessions and can be selected by an operator (and changed, if required) and then used for performing the measurement. In the case at hand, among other things, the control device 13 includes pulse sequences that operate in accordance with the invention-based method. Subsequently, by means if FIGS. 3A and 3B, an example of such a pulse sequence is described in more detail.

To emit the individual RF pulses of a pulse sequence PS, the central control device 13 has a radio-frequency transmission system 15, which produces, amplifies and supplies via a suitable interface (not shown) the RF pulses to the RF antenna transmission system 5. For controlling the gradient pulses of the gradient system 6 in order to appropriately switch the gradient pulses according to the predetermined pulse sequence, the control device 13 comprises a gradient system interface 16. The sequence control unit 14 communicates in an appropriate manner, for example, through transmission of sequence control data SD, with the radio-frequency transmission system 15 and the gradient system interface 16 in order to perform the pulse sequences. In addition, the control device 13 comprises a radio-frequency reception system 17 (that also communicates in an appropriate manner with the sequence control unit 14), in order to receive within the scanning window predetermined by the pulse sequence PS and coordinated by means of the RF antenna reception system 7 magnetic resonance signals, in the context of the present invention echo signals (described below) and thus, after digitalization, demodulation and low pass filtering, acquire the complex raw data for the individual slices.

Here, a reconstruction device 18 accesses the acquired raw data and reconstructs magnetic resonance image data for the slices. Usually, also this reconstruction is performed based on parameters that are predetermined in the respective measurement protocol. For example, these image data can be stored in a memory 19. In the case at hand, the reconstruction device 18 is designed in such a way that it can operate in accordance with the invention-based method which is subsequently described in more detail by means of FIGS. 6 and 7. In particular, it is possible to combine the raw data and/or image data of a slice in a specific data combination unit 20 of the reconstruction device 18. The data combination unit 20 can be formed by software modules and usually does not require any additional hardware component.

The central control device 13 can be operated via a terminal having an input device 10 and a display device 9 by means of which an operator can operate the entire MR system 1. It is also possible to display MR images on the display device 9 and measurements can be planned and started by means of the input device 10, optionally in combination with the display device 9. In particular, as described above, it is possible to select and optionally modify control protocols P with appropriate pulse sequences PS.

Moreover, the invention-based MR system 1 and especially the control device 13 can comprise a plurality of additional components, which are here not particularly shown but which are usually available in such systems, for example, a network interface to be able to connect the entire system with a network and to be able to exchange raw data and/or image data or parameter cards, even additional data, for example, patient-relevant data or control protocols.

Those of ordinary skill in MRI know how to acquire appropriate raw data by radiation of RF pulses and switching of gradient pulses and how to reconstruct MR images from the acquired raw data. Therefore, the process does not require any further description herein. The basic principle of different slice-measuring sequences, for example, the TSE pulse sequences described above is also known. Nevertheless, a typical conventional TSE sequence will be explained using FIG. 2 in order to demonstrate the differences to an invention-based pulse sequence which is described below in more detail by means of an example shown in FIGS. 3A and 3B. In a conventional manner, the arrangement of the RF and gradient pulses, magnetic resonance signals (echo signals) and scanning windows over the time t (from left to right) is displayed on respectively different axes in the pulse diagrams of FIG. 2, as well as FIGS. 3A and 3 B. On the top axis, the RF pulses and echo signals are represented, on the second axis the gradient pulses in slice selection direction, on the third axis the gradient pulses in readout direction, on the fourth axis the gradient pulses in phase encoding direction, and on the bottom axis the scanning windows. The following applies to the three gradient axes: the horizontal axis represented by a dotted line is the respective zero line. The height of the signals represents (not necessarily true to scale), respectively, the relative amplitude. The sign of the amplitude (in relation to the zero axis) corresponds to the direction of the gradient field. Some of the gradient pulses shown in the figures have one or several capital letters. These letters represent the zero moment of a gradient pulse or the zero moment accumulated by the gradient pulse during a time interval. These moment specifications have the purpose of facilitating the understanding of the pulse sequence. In particular, different gradient pulses or partial intervals of different gradient pulses which accumulate the moment equal to zero are provided with the same capital letter.

Figure 2:
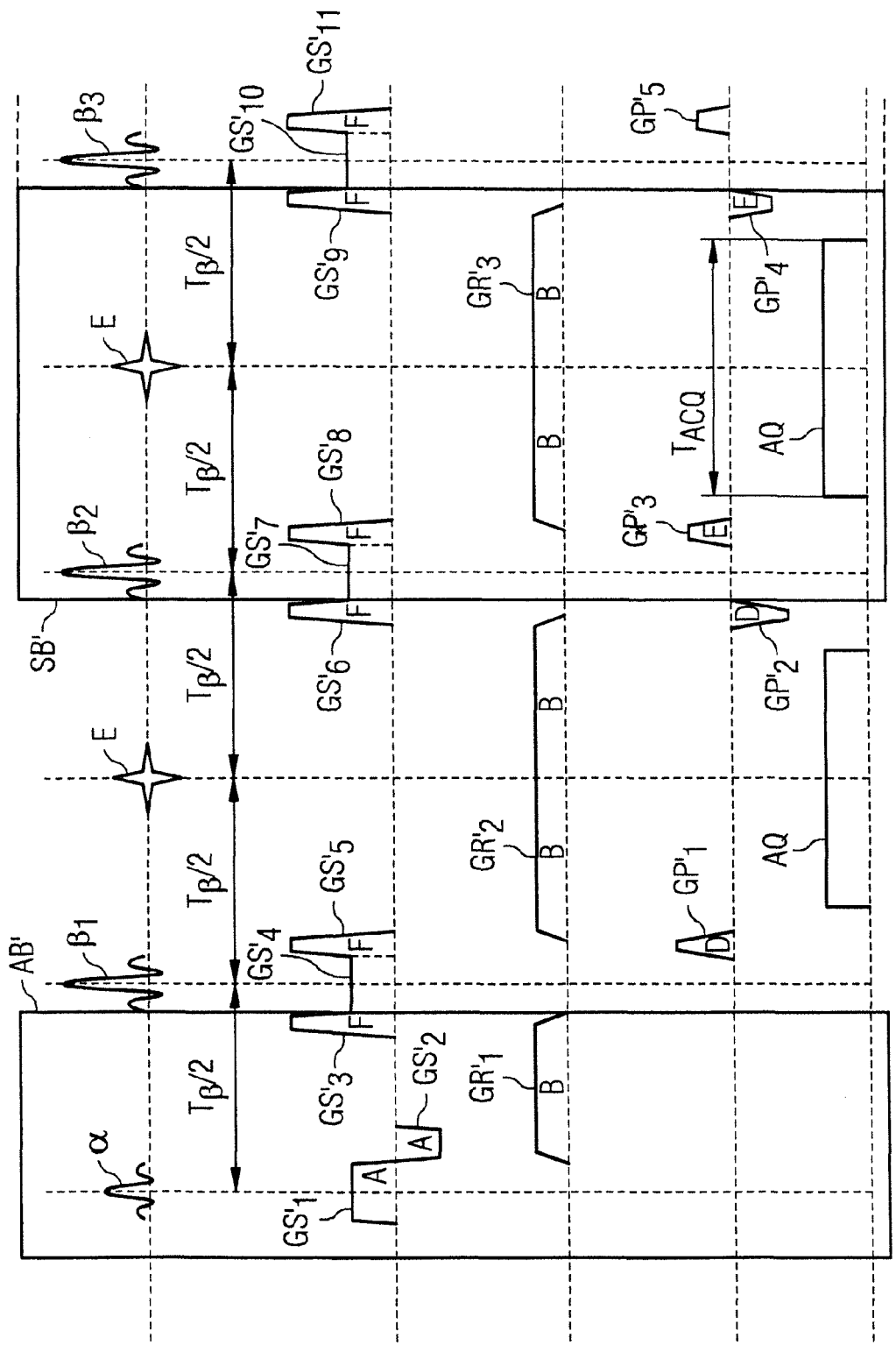
FIG. 2 shows an example of a pulse pattern for a sequence of a conventional single slice TSE pulse sequence in prior art.

FIG. 2 shows the first two echoes E of a conventional TSE sequence in prior art. The sequence starts with a slice-selective 90° RF slice excitation pulse a (subsequently called "excitation pulse"), succeeded by a series of slice-selective RF refocusing pulses $\beta_1$, $\beta_2$, $\beta_3$ (subsequently called "refocusing pulse"). After each refocusing pulses $\beta_1$, $\beta_2$, $\beta_3$ exactly one echo is formed, which is read is a particular scanning window (readout interval) AQ. At the same time, the duration $T_{ACQ}$ of the scanning window AQ is determined by the number of data points that have been read and the time interval of two data points, known as dwell time. FIG. 2 shows only three refocusing pulses $\beta_1$, $\beta_2$, $\beta_3$, in T2-weighted imaging the number is usually considerably higher (even in the invention-based pulse sequence shown below and any variations thereof) and varies, depending on the application, between three and several hundred refocusing pulses. The number of refocusing pulses is also called echo train length (ETL).

The represented sequence fulfills the so-called Carr Purcell Meiboom Gill condition (CPMG condition), which ensures that echo signals E of spins that follow different coherent echo paths are constructively superimposed at the echo moment. Among other things, the CPMG condition requires that each phase which a spin acquires between any two consecutive refocusing pulses $\beta_1$, $\beta_2$, $\beta_3$ has to be equal. For example, the CPMG condition is described in more detail in the "Handbook of MRI Pulse Sequences", Elsevier Academic Press; illustrated edition (Sep. 21, 2004); ISBN- 10: 0120928612; ISBN-13: 978-0120928613 by Matt A. Bernstein, Kevin E. King, Xiaohong Joe Zhou.

First, the time interval $T_\beta$ between the refocusing pulses $\beta_1$, $\beta_2$, $\beta_3$ is selected to be twice as long as the time interval between the isodelay point of the excitation pulse and the center of the first refocusing pulse $\beta_1$.

Secondly, the phase of the refocusing pulses is rotated by 90° compared to the phase of the excitation pulse (i.e., when, for example, the $B_1$ field of the excitation pulse extends along the x-axis in a coordinate system rotating about the z-axis in which the $B_0$ field is located, the $B_1$ field of the refocusing pulse is applied parallel or anti-parallel to the y-axis).

At the excitation pulse $\alpha$, as well as the refocusing pulses $\beta_1$, $\beta_2$, $\beta_3$, the width of the excited slice is, respectively, controlled by the bandwidth of the RF pulse and by a slice selection gradient pulse $GS'_1$, $GS'_4$, $GS'_7$, $GS'_{10}$, which is present during the radiation of the excitation or refocusing pulse $\beta_1$, $\beta_2$, $\beta_3$. Directly prior to or directly following each refocusing pulse $\beta$, a respective crusher gradient $GS'_3$, $GS'_5$, $GS'_6$, $GS'_8$, $GS'_9$, $GS'_{11}$ is switched which have the function of dephasing the FID of the refocusing pulse $\beta_1$, $\beta_2$, $\beta_3$ prior to the subsequent scanning window AQ, so that it does not supply any signal contribution. FID (free induction decay) signifies the transient signal of a spin system induced by a single RF pulse. In other words, it involves the signal emanating from spins for which the refocusing pulse "acts" as an excitation pulse.

At the same time, the left and right crusher gradient $GS'_3$, $GS'_5$ are supposed to have the same zero moment. In the figures, the absolute value of the moment of a gradient pulse (which corresponds through the surface below the pulse to the amplitude of the gradient integrated by time) is represented by capital letters in the respective surface area of the pulse. Consequently, the capital "F" in FIG. 1 show that the left and the right crusher gradient $GS'_3$, $GS'_5$ have the same moment. Furthermore, the crusher gradients $GS'_3$, $GS'_5$, $GS'_6$, $GS'_8$, $GS'_9$, $GS'_{11}$ of different refocusing pulses $\beta_1$, $\beta_2$, $\beta_3$ also have again the same moment F. Any different selection infringes the CPMG condition.

After the excitation pulse $\alpha$, a slice re-phasing gradient pulse $GS'_2$ is required, the moment $-A$ of which is equal to the negative of the moment A accumulated through the slice selection gradient pulse $GS'_1$ between the isodelay point of the excitation pulse $\alpha$ and the end of the slice selection gradient pulse $GS'_1$.

The temporal sequence of the PF pulses is arranged in the manner that a spin echo signal E is formed at the moment $T_\beta/2$ following each refocusing pulse a.

Each spin echo signal E is frequency-encoded by a readout gradient pulse $GR'_2$, $GR'_3$. A readout pre-phasing gradient pulse $GR'_1$ between the excitation pulse a and the first refocusing pulse $_\beta 1$, the moment B of which coincides with the moment B which accumulates a spin from the start of the readout gradient pulse $GR'_2$, $GR'_3$ until the center of the echo signal E, makes sure that the total moment is zero at the time of the echo signal E.

The second part of the readout gradient $GR'_2$, $GR'_3$ following the echo also has the surface B and is therefore used as pre-phasing gradient for spins that follow coherent echo paths, which are located between more than one pair of refocusing pulses $\beta_1$, $\beta_2$, $\beta_3$ in the transverse plane.

For phase-encoding the echo signal E, provision has been made for a phase-encoding gradient pulse $GP'_1$, $GP'_3$ which is, respectively switched between the end of the refocusing pulse $\beta_1$, $\beta_2$, $\beta_3$ and the start of the scanning window AQ'. After the end of the readout interval AQ and prior to the start of the next refocusing pulse $\beta_2$, $\beta_3$, the moment D, E acquired by said gradient pulse $GP'_1$, $GP'_3$ has to be compensated with a moment $-D$, $-E$ by a phase refocusing gradient pulse $GP'_2$, $GP'_4$, in order to fulfill the above-mentioned CPMG condition.

For drawing-related reasons, FIG. 2 shows only the first two echo signals E. By repeating the framed sequence block SB', it is possible to obtain the sequence diagram for the complete sequence variation which consists of the excitation block AB' with the excitation pulse $\alpha$ and the subsequent echo train. The echo train is configured of several series connected sequence blocks SB'. Each sequence block SB' includes a refocusing pulse with subsequent echo signals E, a slice selection gradient, the right crusher gradient of the inherent refocusing pulse, as well as the right crusher gradient of the following refocusing pulse, a readout gradient, a readout interval AQ, a phase-encoding gradient and an appropriate phase refocusing gradient. When different echo signals E encode different k-space lines, the moment of the phase-encoding gradient $GP'_1$, $GP'_3$ and the phase-encoding refocusing gradient $GP'_2$, $GP'_4$ is varied between the repetitions of the sequence block SB'. All other pulses do not change their value so as not to infringe the CPMG condition.

Figure 3B:
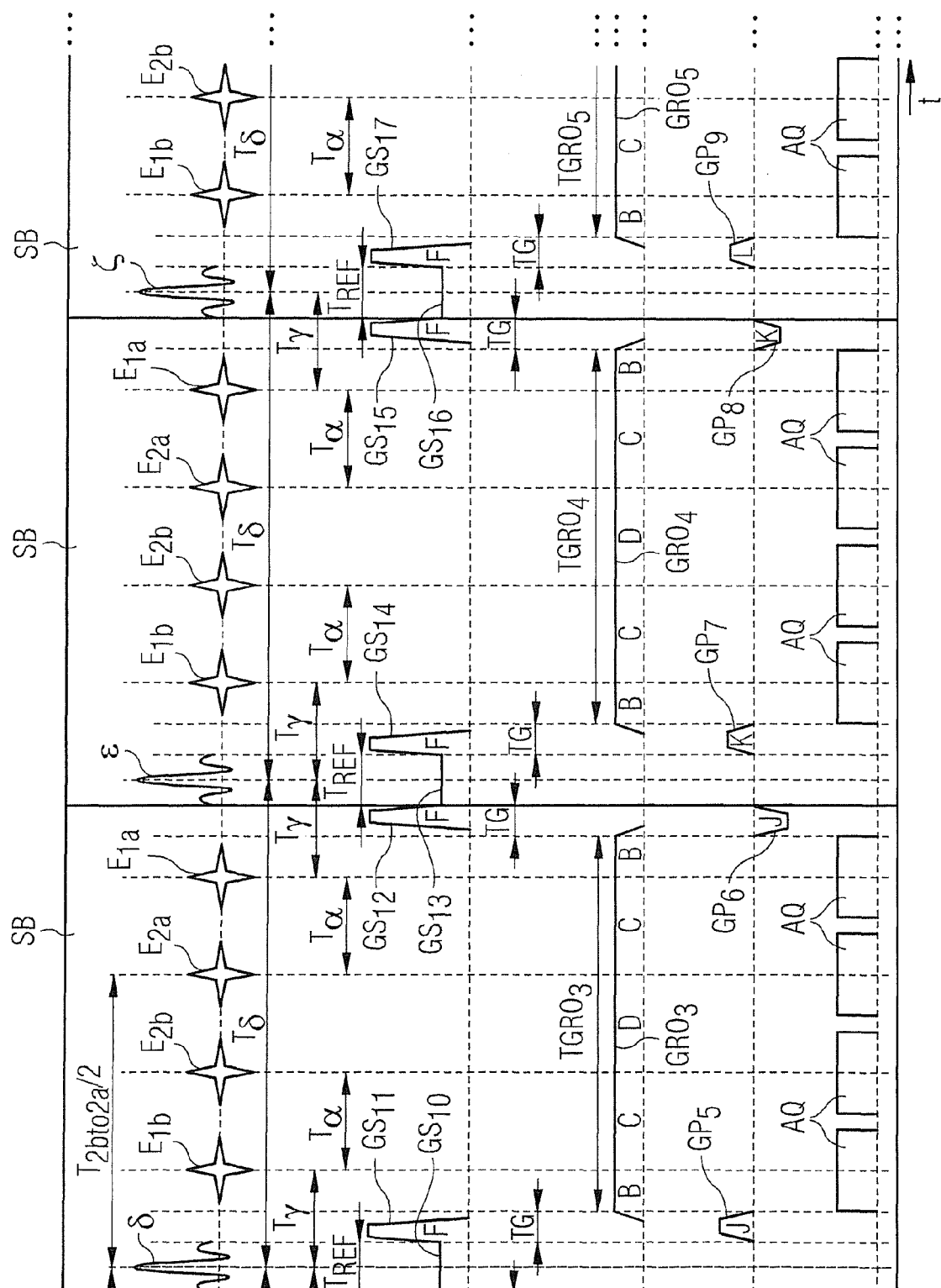

FIGS. 3A and 3B (combined as in FIG. 3) show the start of a pulse sequence for simultaneous refocusing of several excited slices according to a possible embodiment of the invention. To provide a better representation, the pulse diagram was divided in two partial FIGS. 3A and 3B, wherein FIG. 3A shows an excitation block AB in which the slices are excited for the first time, a preparation block Π and a first sequence block $SG_1$. This is followed by a number of sequence blocks SB. Each sequence block $SB_1$, SB starts with a refocusing pulse $\gamma$, $\delta$, $\epsilon$, $\zeta$. FIG. 3B shows the first two of these further sequence blocks SB, as well as the start of a subsequently following similar sequence block SB with a refocusing pulse $\zeta$. At the same time, the pulse diagrams shown in FIGS. 3A and 3B connect seamlessly to one another at the dash-dotted line. As with the conventional pulse sequence shown in FIG. 2, the number of the sequence blocks SB or refocusing pulses within the pulse sequence can be varied in virtually any way and, for example, depending on the application, it can amount to between three and several hundred refocusing pulses. The subsequent description shows that the following sequence blocks SB differ only with regard to the height of the phase-encoding gradient pulses $GP_5$, $GP_7$, $GP_9$ and the phase-encoding refocusing gradient pulses $GP_6$, $GP_8$.

Based on the conventional TSE sequence according to FIG. 2, the following changes have to be made in order to achieve such an invention-based pulse sequence:

Instead of only one slice excitation pulse $\alpha$, at least two slice excitation pulses $\alpha_1$, $\alpha_2$ are now emitted within the excitation block AB in a ("first") time interval $T_\alpha$ from one another. The two slice excitation pulses $\alpha_1$, $\alpha_2$ are exciting the spins in different, usually parallel slices. When thickness of the slices and the radio-frequency bandwidth of both slice excitation pulses $\alpha_1$, $\alpha_2$ coincide, they only differ with regard to their carrier frequency. The length of the time interval $T_\alpha$ between the slice excitation pulses $\alpha_1$, $\alpha_2$ is subsequently described in more detail. To provide a better representation, only the excitation and simultaneous refocusing of m = 2 slices are shown. However, it is certainly possible to use the sequence for a simultaneous refocusing of more than two slices (i.e., m = 2).

Furthermore, for the preparation of magnetization, so-called "diffusion gradient pulses" $GS_3$, $GS_5$ are inserted left and right of the refocusing pulse R. The time $T_\beta/2$ between the last slice excitation pulse $\alpha_2$ and the refocusing pulse, and thus also the time $T_\beta$ is extended depending on the desired maximum diffusion weighting (and thus with the period of the diffusion gradient). The diffusion preparation can be performed simultaneously on one, two or all three spatial axes. To provide a clearer view, in FIG. 3 it is shown only on the slice selection axis. When the diffusion gradients have sufficient moment, the crusher gradients $GS'_3$, $GS'_5$ shown in FIG. 2 can be eliminated about the first refocusing pulse $\beta$, because their function is assumed by the diffusion gradient pulses $GS'_3$, $GS'_5$. The preparation block $\Pi$ shown in FIG. 3A is only to be viewed as an example. It can be substituted by a number of other blocks, depending on the desired preparation. Subsequently, it is only required that the preparation block is designed in such a way that it forms an echo with respect to its temporal symmetrical axis. Thus it will usually have at least one refocusing pulse $\beta$. In other words, when an excitation pulse is emitted in a temporal interval $T_\beta/2$ prior to the temporal center of the preparation block $\Pi$, said excitation pulse forms an echo in the temporal interval $T_\beta/2$ following its temporal center. Therefore, the simplest embodiment involves a single symmetrical refocusing pulse $\beta$, the temporal center of which coincides with the temporal center of the preparation block $\Pi$, flanked by two crusher gradients.

Furthermore, the refocusing pulses $\beta$, $\gamma$, $\delta$, $\epsilon$, $\zeta$ are designed in such a way that they respectively acquire or impact at least partially the slice excited by the excitation pulse $\alpha_1$, as well as the slice excited by the excitation pulse $\alpha_2$. In the simplest case, this is achieved by elevating the width of the refocused slice in relation to the width of the excited slices. When $\Delta z$ depicts the width of an excited slice and d is the interval between the two slices, the width of the slice achieved by a refocusing pulse $\beta_1$, $\beta_2$, $\alpha_3$ is selected at least $d+\Delta z$ (or with m slices in a more general form $(m-1) \times d+\Delta z$). For example, when the radio-frequency bandwidth of the refocusing pulses $\alpha_1$ $\alpha_2$, $\beta_3$ from the sequence shown in FIG. 2 is maintained, this can be achieved in that the amplitudes of the slice selection gradient pulse $GS'_4$, $GS'_7$, $GS'_{10}$, $GS'_{13}$, $GS'_{16}$ respectively emitted with the refocusing pulse $\beta$, $\gamma$, $\delta$, $\epsilon$, $\zeta$ is reduced in relation to the slice selection gradient pulse $GS'_4$, $GS'_7$. Furthermore, when the carrier frequency of the refocusing pulse $\beta$, $\gamma$, $\delta$, $\epsilon$, $\zeta$ is selected, respectively, in such a way that the center of the refocusing slice is located exactly in the center of the m excited parallel slices. The crusher gradient pulses $GS'_6$, $GS'_8$, $GS'_9$, $GS'_{11}$, $GS'_{12}$, $GS'_{14}$, $GS'_{16}$, $GS'_{17}$ do not have to be adjusted.

While in the conventional pulse sequence according to FIG. 2 exactly one echo is formed after each refocusing pulse $\beta_1$, $\beta_2$, $\beta_3$, the invention-based sequence produces up to 2 m echo signals $E_{1a}$, $E_{1b}$, $E_{1a}$, $E_{2b}$ after each refocusing pulse $\beta$, $\gamma$, $\delta$, $\epsilon$, $\zeta$, wherein m represents the number of the simultaneously refocused slices. Therefore, in FIGS. 3A and 3B, m=2.

If all readout parameters would maintain the pulse sequence shown in FIG. 2 and thus also the readout duration $T_{ACQ}$, the ("third") time interval $T_\delta$ between two refocusing pulses $\gamma$, $\delta$, $\epsilon$, $\zeta$ of the further sequence blocks SB would have to be appropriately adjusted.

Alternatively, it is also possible to reduce the readout duration $T_{ACQ}$ of the scanning windows AQ, for example, by reducing the dwell time by a factor a. When the field of view (FoV) and the number of read data points remain unchanged, it means that the amplitude of the readout gradient pulses $GR_2$, $GR_3$, $GR_4$, GR5 has to be increased by the same factor a in relation to the readout gradient pulses $GR'_2$, $GR'_3$ according to FIG. 1 so that the k-space interval of the readout points remains unchanged. At the same time, said factor a is limited by the maximum gradient amplitude of the gradient system and the minimum dwell time of the analog to digital converter.

The time interval between the m first consecutive echo signals $E_{1b}$, $E_{2b}$ and the m last consecutive echo signals $E_{1a}$, $E_{2a}$ after each refocusing pulse $\beta$, $\gamma$, $\delta$, $\epsilon$, $\zeta$ is equal to the time interval $T_\alpha$ of the slice excitation pulse $\alpha_1$, $\alpha_2$. To avoid that the different scanning windows AQ are overlapping with the different echo signals $E_{1a}$, $E_{2a}$, $E_{1b}$, $E_{2b}$, the duration $T_{ACQ}$ of the scanning windows AQ has been determined so that the time interval $T_\alpha$ between two consecutive echo signals $E_{1a}$, $E_{2a}$, $E_{1b}$, $E_{2b}$, is limited downward:

$$T_\alpha \geq T_{ACQ} \tag{1}$$

In a preferred embodiment of the invention, provision has been made that spin echoes and gradient echoes coincide. In the context of the present invention, this "coincidence" of spin echoes and gradient echoes has to be understood as follows: "gradient echoes" involve that the phase accumulated as a result of the switched gradient fields (with the exception of the phase encoding gradients) have to be zero at the echo moment. This is a vital prerequisite for forming an echo. The "spin echo" involves that the phase accumulated as a result of a local off-resonance is zero at the echo moment. For example, a CPMG-TSE sequence (described, for instance, in the context of FIG. 2) fulfills at each echo moment this gradient condition, as well as the spin echo condition. Consequently, in this case, spin echo and gradient echo coincide.

By this coincidence of spin echoes and gradient echoes, it is achieved that the sequence is robust against local inhomogeneities of the $B_0$ field. The first spin echo is formed after the time interval $T_\gamma$ following the refocusing pulse $\gamma$ of the first sequence block $SB_1$, wherein $T_\gamma$ represents the time interval between the last echo signal $E_{1a}$ formed by the preparation module $\Pi$ and the isodelay point of the refocusing pulse $\gamma$. As described below, the position of the first gradient echo can be determined by selecting the readout pre-phase gradient pulse GRP between the last slice excitation pulse $\alpha_2$ and the preparation block $\Pi$.

Preferably, the ("second") time interval $T_\gamma$ is selected at first as short as possible, in order to implement the shortest possible echo spacing $T_\delta$. (The time interval between two consecutive refocusing pulses, i.e., in this case the space between two sequence blocks is described as echo spacing $T\delta$.) As a result, it is possible to keep at a minimum the so-called "T2 blurring", i.e., blurring artifacts due to an unavoidable T2 dissolution along the echo train. FIG. 3A shows that the time interval $T_\gamma$ is limited downward by the duration $T_{REF}$ of the refocusing pulse $\beta$, $\gamma$, $\delta$, $\epsilon$, $\zeta$, the duration $T_{ACQ}$ of an excitation interval AQ and a period TG:

$$T_\gamma \geq T_{REF}/2 + TG + T_{ACQ}/2 \tag{2}$$

The period TG is the time required for phase encoding, a crusher gradient or for accelerating the readout gradient. Since the above-mentioned gradient pulses are usually switched in parallel, the longest one determines the period TG.

With the selection of the time intervals $T_{ACQ}$, $T_\alpha$ and $T_\gamma$, it is also possible to determine the time interval $T_\gamma$ of two consecutive refocusing pulses $\beta$, $\gamma$, $\delta$, $\epsilon$, $\zeta$ of the sequence blocks $SB_1$, SB:

$$T_\delta \geq 2 \times (m-1) T_\alpha + 2 \times T_\gamma + T_{ACQ} \tag{3}$$

With these time periods $T_\alpha$ and $T_{ACQ}$, in turn, the "flattop duration" $TGRO_2$ (the period of the medium range of a trapezoidal pulse in which the amplitude does not vary) of the readout gradient $GRO_2$ of the first sequence block $SB_1$ is limited downward:

$$TGRO_2 \geq T_{ACQ} + (2m-2) \times T_\alpha + (T_\delta - (2m-2 \times T_\gamma) = T_{ACQ} + T_\delta - 2 \times T_\gamma \quad (4)$$

Again, in order to keep the "T2 blurring" as low as possible, it is preferred to select the time period $T_\delta$ as short as possible which, in turn, results in the fact that $TGRO_2$ is limited upwardly:

$$TGRO_2 \leq T_\delta - T_{REF} - 2 \times TGRO_{RT}. \quad (5)$$

At the same time, $TGRO_{RT}$ represents a ramp time of the symmetrical readout gradient pulse, which is limited downward as follows by the maximum gradient rise time S and the amplitude of the readout gradient $A_{GRO}$:

$$TGRO_{RT} \geq S \times A_{GRO} \quad (6).$$

The same time conditions apply to the readout gradients $GRO_3$, $GRO_4$, $GRO_5$ of the further sequence blocks SB or their "flattop durations" $TGRO_3$, $TGRO_4$, $TRGO_5$.

Even if the echo signals $E_{2a}$, $E_{1a}$ formed by the preparation block Π are read, it is possible to switch a readout gradient pulse $GRO_1$ at the appropriate point in time. Usually, said readout gradient pulse $GRO_1$ has the same amplitude $A_{GRO}$ and the same ramp time as the following readout gradient pulses $GRO_2$, $GRO_3$, $GRO_4$, $GRO_5$ of the sequence blocks $SB_1$, SB. If, in addition, the flattop duration is selected prior to the first echo signal $E_2$ and after the last echo signal $E_1 a$ corresponding to the design of the readout gradient pulses $GRO_2$, $GRO_3$, $GRO_4$, $GRO_5$, it results in a total moment of the first readout gradient $GRO_1$ of $2 \times B + (m-1) \times C$. However, this is not a mandatory selection. It is also possible to omit completely the readout gradient $GRO_1$, if the echo signals $E_{2a}$, $E_{1a}$ formed by the preparation block Π should not be read. However, such deviations have to be taken into consideration when determining the zero moment of the readout pre-phase gradient pulse GRP. Optionally, it is possible that the echo signals $E_{2a}$, $E_{1a}$ are phase encoded by switching a phase encoding gradient and a phase refocusing gradient with opposite signs and equal absolute zero moment (in FIG. 3A zero moment G).

Between the slice selection gradient $GS_{1,1}$, $GS_{1,2}$ of two consecutive slice excitation pulses $\alpha_1$, $\alpha_2$, a gradient $GS_{2,1}$ is switched in slice selection direction, the zero moment of which is equal to the negative of the sum of the moment accumulated between the isodelay point of the first excitation pulse $\alpha_1$ and the end of the first slice selection gradient $GS_{1,1}$ and the moment accumulated between the start of the second slice selection gradient $GS_{1,2}$ and the isodelay point of the second excitation pulse $\alpha_2$. Consequently, its sign is opposite to the sign of the slice selection gradients $GS_{1,1}$ and $GS_{1,2}$. When using symmetrical slice selection gradients $GS_{1,1}$, $GS_{1,2}$ and excitation pulses $\alpha_1$, $\alpha_2$ and centering the isodelay points in the center of the flattops of the slice selection gradient $GS_{1,1}$, $GS_{1,2}$, as shown in FIG. 3A, the moment of this gradient $GS_{2,1}$ amounts to $-2A$, and thus it is equal to the negative moment 2A of a slice selection gradient $GS_{1,1}$ and $GS_{1,2}$. Under the above-mentioned conditions, the actions of the gradients can also be interpreted for easier understanding as follows: anticipatory, the gradient $GS_{2,1}$ compensates the moment that the spins of the first slice excited by the first excitation pulse $\alpha_1$ will be accumulated in sequence of the slice selection gradient $GS_{1,2}$ of the second excitation pulse $\alpha_2$. The gradient pulse $GS_{2,2}$ immediately following the last excitation pulse $\alpha_2$ in slice selection direction operates as mutual slice refocusing pulse of the first excitation pulse $\alpha_1$ and the second excitation pulse $\alpha_2$.

Between two consecutive excitation pulses $\alpha_1$, $\alpha_2$, a further gradient pulse $GRO_0$ is switched in readout direction the zero moment C of which corresponds according to amount exactly with the zero moment which is accumulated in readout direction between two consecutive echo signals (from the group of the first m echo signals $E_{1b}$, $E_{2b}$ or from the group of the last m echo signals $E_{2a}$, $E_{1a}$). Therefore, FIG. 3A reads as follows:

$$|C| = |T\alpha \times A_{GRO}| \quad (7),$$

wherein $A_{GRO}$ represents the amplitude of a readout gradient pulse $GRO_2$, $GRO_3$, The sign of the gradient $GRO_0$ depends on the number of refocusing pulses within the preparation module. When that number is unequal, the gradient $GRO_0$ has the same sign as the readout gradients $GRO_1$, $GRO_2$, . . . , otherwise it has an opposite sign.

Furthermore, for spin echoes to coincide in the desired manner with gradient echoes, the temporal position and the zero moment of the readout pre-phase gradient pulse GRP have to be appropriately selected. This allows for great freedom. Subsequently, a distinction is made between two cases that are especially important in practice. For each case, sufficient design criteria are provided that would result in a concurrence of spin echoes and gradient echoes. However, these design criteria do not claim completeness. It is also possible to find different equivalent solutions.

In the first case shown in FIG. 3A, the first m echoes formed by the preparation block Π are read. In this case, it is preferred (but not required) to apply readout pre-phase gradient pulse GRP between the last slice excitation pulse $\alpha_2$ and prior to the preparation block Π. The zero moment of the readout pre-phase gradient pulse GRP is now selected in such a way that the phase that accumulates the spins of the last excited slice $\alpha_2$ between the start of the preparation block Π and the first echo $E_{2a}$ of the slice following the preparation module Π is exactly compensated. Because of the fact that each refocusing pulse negates the phase accumulated by the preceding gradients, it is particularly important to consider the number of refocusing pulses of the preparation block Π. In the example depicted the moment GRP is equal to the moment B, which is accumulated by the readout gradient $GRO_1$ between start and spin echo $E_{2a}$.

Furthermore, in this case, the moment that is accumulated in readout direction between the last echo $E_{1a}$ (of the slice $\alpha_1$ excited first) formed by the preparation block Π and the first sequence block $SB_1$ is selected equal to the moment that is accumulated in readout direction within the sequence block $SB_1$ between refocusing pulse $\gamma$ and first echo $E_{1b}$. The symmetrical form of the readout gradient $GRO_1$ shown in FIG. 3A fulfills this criterion in a "natural" manner.

Therefore, at the echo moment of the echo signal $E_{2b}$ shown in FIG. 3A, the total moment amounts to zero:

$$B - (2B+C) + (B+C) = 0. \quad (8)$$

In a second case (not shown), the first m echoes formed by preparation block Π are not read (i.e., the readout gradient $GRO_1$ is omitted here, if readout is not performed but the readout gradient $GRO_1$ is switched, the first case applies) and the preparation block Π is self-refocusing. The term "self-refocusing" means that all. gradients switched by the preparation block Π are compensated in readout direction within the preparation block Π. Because of the symmetrical design of the preparation block Π with respect to the temporal symmetrical axis, this requirement is usually fulfilled in a natural manner or it is easy to fulfill.

In this second case, it is preferred (but not required) to apply the readout pre-phase gradient pulse GRP between the last echo $E_{1a}$ formed by the preparation block Π and the start of the first sequence block $S_{B1}$. Its moment is selected equal to the moment B that is acquired in readout direction within the sequence block $SB_1$ between refocusing pulse γ and first echo $E_{1b}$. In this procedure, m−1 further pre-phase gradients are switched, respectively, with a moment C between the echoes formed by the preparation block Π.

Subsequently, for easier understanding, the function of the invention-based pulse sequence described above is explained in more detail, wherein these explanations apply in general to such pulse sequences with m excited and simultaneously refocused slices.

For this purpose, it is first of all necessary to consider the spins in the slice which are impacted by the last excitation pulse $α_m$ (in FIG. 3A the second slice excited by the excitation pulse $α_2$). All preceding excitation pulses $α_1, \ldots, α_{m-1}$ (in FIG. 3A the first excitation pulse $α_1$) do not impact these spins because the resonance condition has not been fulfilled. As a result, all preceding gradient pulses do not have an impact on the spins because the longitudinal magnetization is not impacted by gradient fields.

A first echo is formed by the effect of the preparation block Π at the temporal interval $T_β$ following the excitation pulse $α_m$. At this moment, the phase accumulated by the readout pre-phase gradient GRP (with the total moment B) is exactly compensated by the first part of the readout gradient $GRO_1$ and thus produces a simultaneous gradient echo, which can be read in the echo signal group $E_{ma}$ ($E_{2a}$ in FIG. 3A). (here and subsequently, the echo signals are described as "echo signal groups" because, as explained above, for the most part several signals coincide.)

The spins involved in this echo signal $E_{2a}$ are again refocused by the refocusing pulse γ of the first sequence block $SB_1$ and form a spin echo following the refocusing pulse γ at a time interval $T_{2ato2b}/2=T_α+T_γ$. Again, at the echo moment, the phase that has been accumulated by the second half of the readout gradient $GRO_1$ (total moment C+B) since the first echo is exactly balanced by the phase (total phase B+C) accumulated as a result of the second readout gradient $GRO_2$, thus making it possible to read the echo in the echo group $E_{mb}$ of the first sequence block $SB_1$.

This signal (or the impacted spins) is again refocused by the refocusing pulse δ of the second sequence block SB (i.e., of the first of the further sequence blocks SB) and forms a second spin echo after a time interval $T_{2bto2d}/2=T_δ+T_γ$). This involves the signal directly refocused twice of the first echo signal of the second slice formed by the preparation block Π (In the example depicted in FIGS. 3A and 3B, the echo formed by the preparation block Π is already a spin echo. Here, counting starts only after the preparation block Π, in order to keep to the extent possible the description independent of the special embodiment of the preparation block.) Again, at this further echo moment, the phase that was accumulated as a result of the readout gradient $GRO_2$ between the first spin echo and the refocusing pulse δ (i.e., the total moment D=C+B) has been exactly compensated by the phase that is accumulated by the third readout gradient $GRO_3$ between the refocusing pulse δ and the second spin echo. Therefore, it is possible to use also the second spin echo in the echo signal group $E_{2a}$ of the second sequence block SB. At the same time, the echo spacing $T_{2ato2b}$ describes the time interval between an echo of the echo signal group $E_{2a}$ and the following echo of the echo signal group $E_{2b}$. Correspondingly, the echo spacing $T_{2bto2a}$ depicts the time interval between an echo of the echo group $E_{2b}$ and the following echo of the echo group $E_{2a}$.

In the second sequence block SB, the first stimulated echo of the second slice is also formed by the mutual impact of the refocusing pulses γ and δ. Again, the first radio-frequency pulse $α_m$ operates as a slice excitation pulse which folds magnetization in the transverse plane. When the echo has been stimulated, the refocusing pulse γ of the first sequence block $SB_1$ operates as a so-called restore pulse, i.e., it folds back part of the transverse magnetization in longitudinal direction which is then folded again into the transverse plane by the refocusing pulse δ of the second sequence block SB. It is said that said magnetization is stored in longitudinal direction between refocusing pulse γ and refocusing pulse δ because, as longitudinal magnetization, it is not impacted by the gradient fields and only subjected to the relatively slow T1 relaxation. Consequently, this first stimulated echo is formed at the time interval $T_{2ato2b}/2=T_α+T_γ$ following the refocusing pulse δ in the echo group $E_{2b}$ of the second sequence block SB. Also at this moment, the phase acquired as a result of readout gradient $GRO_1$ is exactly compensated by the phase acquired as a result of readout gradient $GRO_3$ (the total moment amounts to B+C), resulting in the fact that the stimulated echo and the gradient echo coincide. The first stimulated echo and the second spin echo (the directly refocused first spin echo) of the latest excited slice do not coincide temporally and can be read separately. This distinguishes the sequence from a sequence block SB' of a CPMG sequence shown in FIG. 2 or the sequence block SB disclosed in DE 10 2012 204 434. This is advantageous because, for the reasons described above, the phase position of the echo formed by the preparation block Π is not known and therefore the $B_1$ vector of the refocusing pulse cannot be applied parallel or anti-parallel to said phase position. However, this is a prerequisite for constructive overlapping of the second spin echo and the first stimulated echo.

Subsequently, the spins in the first slice which are impacted by the first excitation pulse $α_1$ are considered. The bandwidth of the slice excitation pulses $α_1$, $α_2$ and the amplitude of the slice selection gradients $GS_{1,1}$, $GS_{1,2}$ are selected in such a way that the spins of a slice are not impacted by the following excitation pulses $α_2, \ldots, α_m$, (in the simplified example shown in FIG. 3A only $α_2$). However, because of the fact that all gradient fields that are switched after a slice excitation pulse impacts the spins that have been tipped into the transverse plane by the slice excitation pulse, the spins of the first slice accumulate, among other things, a zero moment by the slice selection gradient $GS_{2,1}$ of all following slice excitation pulses $α_2$. As described above, in order to avoid that the signal is de-phased by the slice selection gradients $GS_{2,1}$ of the following slice excitation pulses $α_2$, a negative gradient pulse $GS_{2,1}$ with a total moment of -2A was switched in slice selection direction between two consecutive slice excitation pulses $α_1$, $α_2$. One half of the moment (−A) is used as an ordinary slice refocusing moment for the slice selection gradient $GS_{1,1}$ of the preceding excitation pulse $α_i$, (here i =1). The other half of the moment (−A) is used as pre-phase gradient which compensates the positive moment accumulated by the slice selection gradient $GS_{1,2}$ of a subsequent slice excitation pulse $α_{i+1}$ (here $α_2$) between the start of the slice selection gradient $GS_{1,2}$ and isodelay point of the subsequent slice excitation pulse $α_2$. The moment (again A) accumulated by the second half of the slice selection gradient $GS_{1,2}$ of the subsequent excitation pulse is compensated in a conventional manner by the slice refocusing gradient $GS_{2,2}$ of the subsequent slice excitation pulse $α_2$. Because of the fact that a gradient filed does not impact spins that are aligned in longitudinal direction to the basic magnetic field $B_0$, the negative gradient $GS_{2,1}$ between the slice excitation pulses $\alpha_1$, $\alpha_2$ has no impact on the spins that are excited by all subsequent excitation pulses (also here $\alpha_2$).

By the above-mentioned measures for selecting the parameter (thickness of the slices, bandwidth, etc.) of the slice excitation pulses $\alpha_1$, $\alpha_2$, the refocusing pulse S of the preparation block Π simultaneously refocuses the signal of all spins that were excited by one of the m excitation pulses $\alpha_1, \ldots, \alpha_m$. The spins of the first slice, which were excited by the excitation pulse $\alpha_1$, are refocused to a first echo at the moment $T_\alpha + T_\beta/2$ following the first refocusing pulse β (i.e., $2 \times T_\alpha + T_\beta$ following the excitation pulse $\alpha_1$). Switching the gradient pulse $GRO_0$ in readout direction with the zero moment C between two consecutive slice excitation pulses $\alpha_1$, $\alpha_2$ compensates, together with the readout pre-phase gradient pulse GRP, the moment B between the latest slice excitation pulse $\alpha_m$ (here $\alpha_2$) and the preparation block Π, the moment that is acquired as a result of the first readout gradient $GRO_1$ between the preparation block Π and the first echo signal $E_{1a}$ of the first slice. Gradient echo and spin echo of the spins of the first slice are produced simultaneously and can be read as echo group $E_{1a}$ at the moment $T_\alpha + T_\beta/2$ following the refocusing pulse β of the preparation block Π. It should be noted that the spins of previously considered slice m (here slice 2) have again accumulated the moment $(m-1) \times C$ (here only C) at the moment of the first echo of the first slice and are therefore de-phased. This is the case because these spins have not "seen" the gradient between the excitation pulses because it was temporally switched prior to its excitation. Conversely, this gradient impacts the spins of the preceding slice (here the first slice). Therefore, at the moment of the spin echo of slice m, they are still de-phased by a moment $(m-1) \times C$ and do not contribute a signal for the echo group $E_m$ (here $E_2$), despite adequately great moment C. Switching the gradient pulse $GRO_0$ in readout direction with zero moment C between two consecutive slice excitation pulses $\alpha_1$, $\alpha_2$, together with the temporal sequence of the radio-frequency pulses, serves the purpose of securely separating the scanning windows AQ of different slices.

The first echo signal $E_{1a}$ of the first slice is also refocused again by the refocusing pulse γ of the first sequence block $S\alpha_1$ and forms a first spin echo at the moment $T_{1atob}/2 = T_\gamma$ following the refocusing pulse γ. (This involves the directly refocused signal of the first echo of the first slice formed by the preparation block Π. In the example depicted in FIG. 3a, the echo formed by the preparation block Π is already a spin echo. Also in this case, counting starts only after the preparation block Π, in order to keep to the extent possible the description independent of the special embodiment of the preparation block.) At this moment $T_{1atob}/2 = T_\gamma$ following the refocusing pulse γ, the zero moment B accumulated between the echo of the first slice formed by the first readout gradient pulse $GRO_1$ and the refocusing pulse γ is exactly compensated so that the echo in the echo signal group $E_{1b}$ can be read. The signal of the other slices, however, is still de-phased by the first readout gradient pulse $GRO_1$ (for m=2 by the moment C).

Then the signal of the first spin echo of the first slice is again refocused by the refocusing pulse δ of the second sequence block SB and also forms a second spin echo at the moment $T_{1btola}/2 = T_\delta - T_\gamma$. Again, at this moment, the phase that was accumulated as a result of the readout gradient pulse GRO2 between first spin echo and refocusing pulse δ (total moment C+D+C+B) is exactly compensated by the phase that is accumulated by the third readout gradient pulse GRO3 between refocusing pulse δ and second spin echo of the first slice. As a result, it is possible to use also the second spin echo in the echo group $E_{1a}$ of the second sequence block SB.

The first stimulated echo of the echo of the first slice formed by the preparation block Π is produced at the moment $T_\gamma$ following the refocusing pulse δ. The spins of the first slice, which contribute to said stimulated echo, were located in the transverse plane between preparation block Π and refocusing pulse γ of the first sequence block $SB_1$ and, at the same time, accumulated the moment B in readout direction. Their signal was stored in longitudinal direction between the two refocusing pulses γ and δ and therefore the readout gradient $GRO_2$ was ineffective. By the refocusing pulse δ, they were folded back into the transverse plane. At the moment of the stimulated echo, the readout gradient $GRO_3$ of the second sequence block SB exactly compensated the zero moment accumulated prior to the refocusing pulse γ. As a result, it is possible to read the first stimulated echo in the echo group $E_{1b}$ of the second sequence block SB. At this moment, the spin echo of the first slice read in the echo group $E_{1a}$ is still de-phased by a moment 2C+D (in general m×C+D), and the signal of the second slice read in the echo signal groups $E_{2a}$ or $E_{2b}$ is still de-phased by a zero moment D+C or C.

Consequently, it is possible, by means of zero moment C, to control the separation of signals of different slices and, by means of moment D, it is possible to control the separation of signals of different echo paths of the same slice. For example, moment C can be adjusted by selecting $T_\alpha$ in step 2 ($C = T_\alpha \times A_{GRO}$). Subsequently, moment D ($D = (T_\delta - 2T_\gamma - 2 \times (m-1) \times T_\alpha) \times A_{GRO}$) can be adjusted by selecting $T_\delta$ according to formula (3). In this way, it is also possible to safely eliminate radio-frequency artifacts. If, in the process, the time interval $T_\alpha$ or $(T_\delta - 2T_\gamma - 2 \times (m-1) \times T_\alpha)$, which is required for a complete separation of the signals, exceeds the time $T_{ACQ}$, the amplitude could be elevated in readout direction at the time intervals in which no reading is done, in order to minimize the echo spacing at the particular separation moment C or D. However, at the same time, it is important to pay attention to eddy currents resulting from additional gradient circuits. Which procedure would result in an improved image quality depends on a plurality of parameters and is easiest determined in empiric manner.

As previously described, the signals of different slices are separated by means of the temporal sequence of radio-frequency pulses and the gradient moment C. The aspect of separating signals of a slice is further discussed below.

Characteristic for a coherent echo path is the time (subsequently depicted as transverse time) in which the spins following said echo path were situated in the transverse plane. For the above-mentioned echo paths the transverse times are as follows:

| Following the . . . | $E_{1a}$ | $E_{1b}$ | $E_{2a}$ | $E_{2b}$ |
|---|---|---|---|---|
| Preparation block | $T_\beta + 2T_\alpha$ | — | $T_\beta$ | — |
| Sequence block $SB_1$ | — | $T_\beta + 2T_\alpha + 2T_\gamma$ | — | $T_\beta + 2T_\alpha + 2T_\gamma$ |
| 2$^{nd}$ Sequence block SB | $T_\beta + 2T_\alpha + 2T_\delta$ | $T_\beta + 2T_\alpha + 2T_\gamma$ | $T_\beta + 2T_\delta$ | $T_\beta + 2T_\alpha + 2T_\gamma$ |

Starting with the third sequence block SB, also signals originating from spins that followed different echo paths overlap within an echo signal group.

In general, it applies that coherent echo paths of the first slice with a transverse time of $$T_\beta + 2T_\alpha + g \times T_\delta, \quad (9)$$

are acquired in the echo signal group $E_{1a}$ (i.e., in the example of FIGS. 3A and 3B in the respectively fourth scanning window AQ of a sequence block SB), wherein g represents an even whole number, and that echo paths of the first slice, in which the transverse time amounts to $$T_\beta + 2T_\alpha + 2T_\gamma + g' \times T_\delta, \quad (10)$$

wherein g' represents an even whole number, are acquired in the echo group $E_{1b}$ (i.e., in the example of FIGS. 3A and 3B in the respectively first scanning window AQ of a sequence block SB). The same applies to the coherent echo paths of the second slice: the time, in which spins that form echoes within the same echo signal group of the slice were located in the transverse plane differs, respectively, by an even multiple of the echo spacing $T_\delta$.

For example, signals of an echo group of a slice can reach the same echo group of the slice (of a subsequent sequence block SB) with direct double refocusing (and at the same time extend their "transverse time" with double echo spacing $T_\delta$). However, with direct double refocusing the spins do not acquire a phase because of the spin echo principle. The same applies to fourfold, sixfold, and other multiple direct refocusing. Moreover, the sequence design achieves, with single direct refocusing, that the signal is received in the respectively different echo group of the same slice. The same applies to a stimulated echo: the singular storage of the signal in longitudinal direction with subsequent folding back in the transverse plane after any number of echo spacing $T_\delta$ exacts the group transition.

The general validity of the above-mentioned principle can be easiest verified by a phase diagram.

Figure 4:
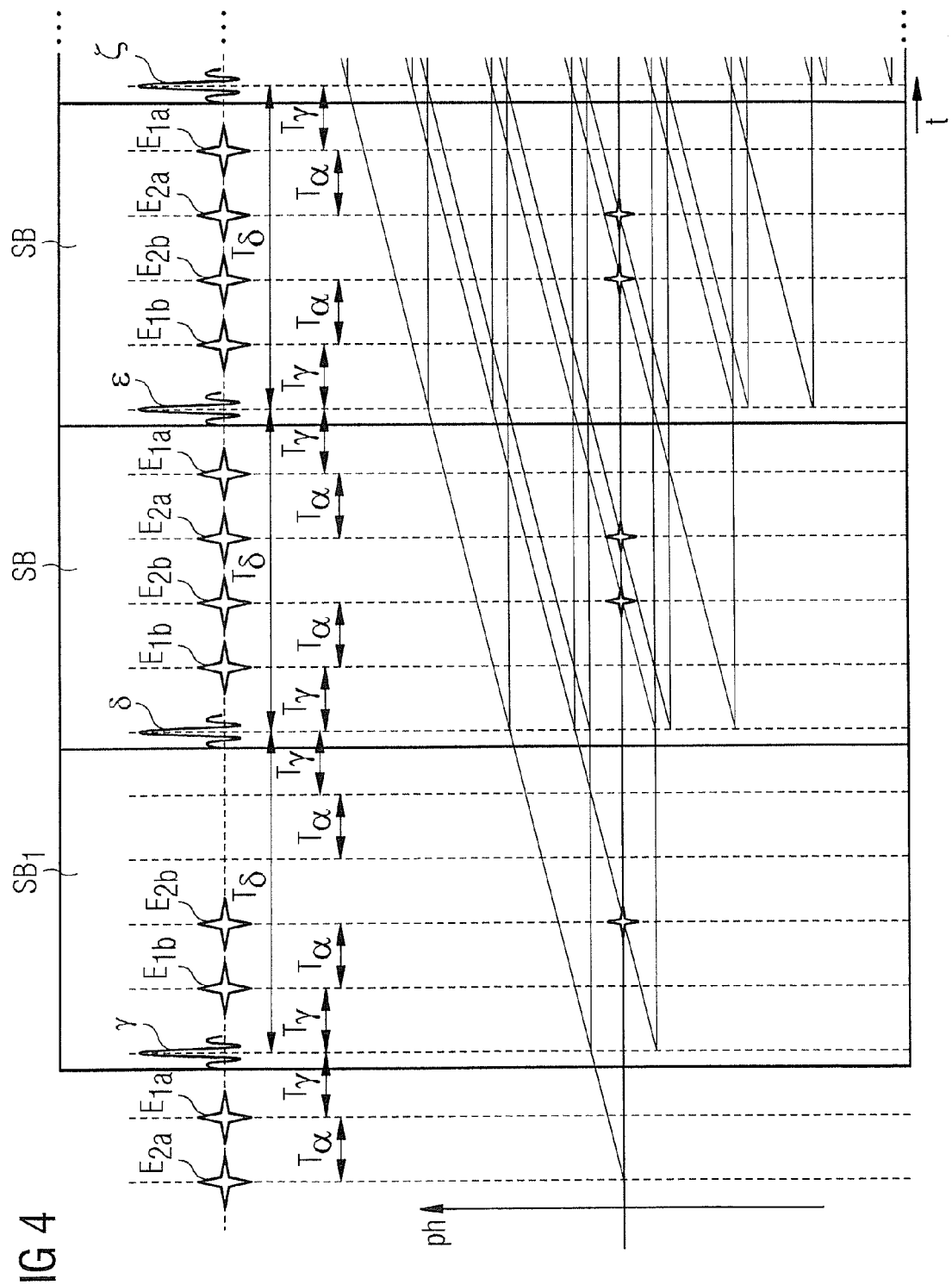
FIG. 4 shows a phase diagram for the second slice when performing a pulse sequence with a pulse pattern according to FIGS. 3A and 3B.
Figure 5:
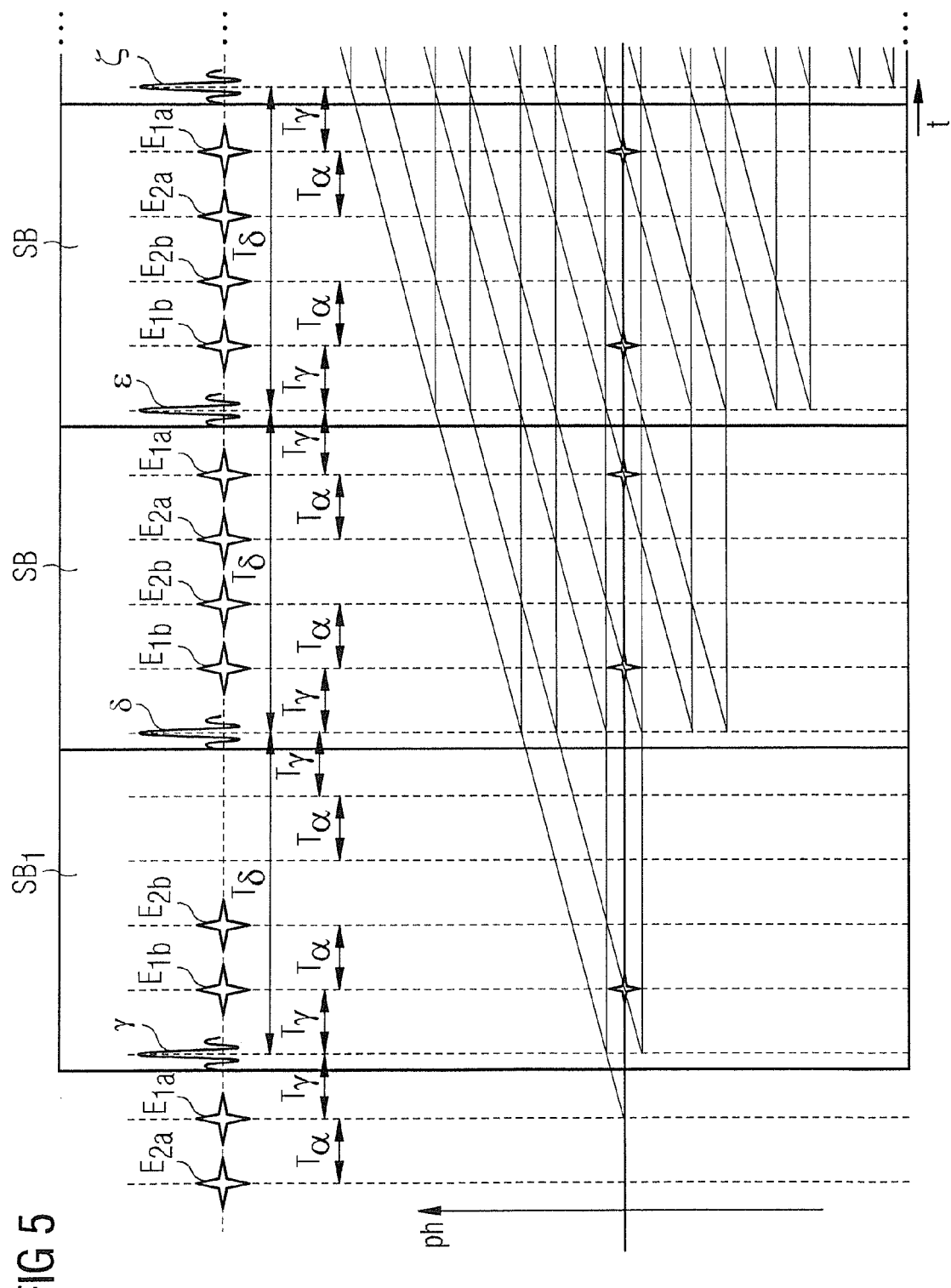
FIG. 5 shows a phase diagram for the first slice when performing a pulse sequence with a pulse pattern according to FIGS. 3A and 3B.

FIG. 4 shows the phase diagram of the second slice for the first three sequence blocks SB1, SB. FIG. 5 shows the respective diagram for the first slice. The vertical axis is always the phase ph of the signal for any position, as long as it is fixed. The horizontal axis is the time t. Each line of the phase diagram corresponds to a coherent echo path. When the spins that follow a particular echo path are located in the transverse plane, they accumulate in linear manner with the time t phase ph. The reason for the phase accumulation is the readout gradient which simplification is assumed to be constant between the refocusing pulses, and/or a local $B_0$ inhomogeneity at the position observed. The phase accumulated as a result of the phase encoding gradient has not been acquired so as not to overcomplicate the representation. The spoiler gradients have been taken into consideration to the extent that refocusing pulses are not the source of new echo paths (with an initial phase of zero), because they suppress these echo paths.

A transverse signal (characterized by an inclined section with phase accumulation) is divided in four new branches (see the respective signal splitting of the refocusing pulses γ, α, ε), by a non-perfect refocusing pulse. A portion of the signal remains unaffected, one portion is refocused and one portion of the signal is stored in longitudinal direction. The non-affected and the refocused branch continue to accumulate as transverse magnetization after the refocusing pulse. The refocused branch is characterized by a change in sign of the phase accumulated prior to the refocusing pulse (i.e., this branch starts in a space under the zero axis in FIGS. 4 and 5, respectively). The two horizontal branches correspond to the signal stored in longitudinal direction (without phase accumulation).

When the signal again impacts a (subsequent) non-perfect refocusing pulse, it is divided in two branches. Either it remains unaffected (horizontal branch which as longitudinal magnetization still does not accumulate phase), or it is folded back in the transverse plane (inclined branch). By maintaining the previously accumulated phase, the latter continues phase accumulation after the refocusing pulse.

When an echo path intersects with the zero axis, an echo is formed at this moment.

It is possible to read the "transverse time" of a specific echo path by adding up the inclined sections from the diagram.

When all k-space lines of one of the excited slices required for image reconstruction are encoded with a sequence module (i.e., a singular excitation of each of the m slices and the subsequent echo train) or several sequence modules (i.e., with repeated excitation of the m slices, each of which followed by the subsequent echo train) of a pulse sequence according to FIGS. 3A and 3B, a complete raw data set for each of the 2 m (here four) echo signal groups is obtained.

Consequently, the splitting in different echo signal groups results in the fact that two complete raw data sets are obtained, respectively, for each slice.

Using the example of echo signal groups $E_{1a}$, $E_{1b}$ of the first slice, we are subsequently describing different possibilities of processing these raw data. All other slices can be processed in the same manner.

If only magnitude images are required, it is possible in a first embodiment to reconstruct one magnitude image, respectively, from the raw data set of the echo signal group $E_{1a}$ and the raw data set of the echo signal groups $E_{1b}$ (for example, if acquired k-space points are located on the grid points of a Cartesian grid, in the usual way by a two-dimensional Fourier transformation from the k-space occupied with these raw data in the image space) and subsequently both magnitude images can be added in order to improve the signal to noise ratio. Because of the preceding absolute-value generation, the incoherent phase information of both data sets does not lead to signal erasion. This procedure is analogous to a procedure that is described by Fritz Schick in the article "SPLICE: Sub-second diffusion mode", published in October 1997 in the journal Magnetic Resonance in Medicine, volume 38, issue 4, pages 638-644. The article describes a TSE sequence in which the CPMG condition is not fulfilled and the slices are separately refocused.

With an alternative method that is based on the sum of squares, it is possible to obtain an image with an improved signal to noise ration. With said method, the combined image $M_1$ (x, y) of the first slice (i.e., the pixel values $M_1$ (x, y) of the first image) is calculated as follows:

$$M_1(x,y) = \sqrt{|I_{1a}(x,y)|^2 + |I_{1b}(x,y)|^2} \quad (11)$$

At the same time, $I_{1a}(x,y)$ is the complete pixel of the image with the spatial image coordinates $_{(x,y)}$ reconstructed from the raw data set of the echo signal group $E_{1a}$, and $I_{1b}(x,y)$ is the corresponding complex pixel of the image reconstructed from the raw data set of the echo group $E_{1b}$. $|I_{1a}(x,y)|$ depicts the amount of the complex pixel:

$$|I_{1a}(x,y)| = \sqrt{Re\{I_{1a}(x,y)\}^2 + Im\{I_{1a}(x,y)\}^2} \quad (12)$$

and, correspondingly, $|I_{1b}(x,y)|$ depicts the amount of the complex pixel $I_{1b}(x,y)$:

$$|I_{1b}(x,y)|=\sqrt{Re\{I_{1b}(x,y)\}^2+Im\{I_{1b}(x,y)\}^2} \qquad (13)$$

In a further preferred embodiment, both complex images $I_{1a}(x,y)$ and $I_{1b}(x,y)$ are first subjected to a phase correction $$\tilde{I}_{1a}(x,y)=I_{1a}(x,y)e^{-i\hat{\phi}_{1a}(x,y)} \qquad (14)$$

$$\tilde{I}_{1b}(x,y)=I_{1b}(x,y)e^{-i\hat{\phi}_{1b}(x,y)} \qquad (15)$$

As subsequently shown by means of FIG. 6, the exponents $\hat{\phi}_{1a}(x,y)$ and $\hat{\phi}_{1b}(x,y)$ are so-called phase maps which can be calculated from the acquired data. Subsequently, the phase corrected images $\tilde{I}_{1a}(x,y)$, $\tilde{I}_{1b}(x,y)$ are added in the complex number range to a complex combined image for the respective slice according to $$\tilde{I}_1(x,y)=\tilde{I}_{1a}(x,y)+\tilde{I}_{1b}(x,y) \qquad (16)$$

Based on this combined image, it is possible to produce a magnitude image of the respective slice according to $$\tilde{M}_1(x,y)=\sqrt{Re\{\tilde{I}_1(x,y)\}^2+Im\{\tilde{I}_1(x,y)\}^2} \qquad (17)$$

and to produce real part images according to $$\tilde{R}_1(x,y)=Re\{\tilde{I}_1(x,y)\}) \qquad (18)$$

and to produce real part magnitude images according to $$\tilde{R}_{B1}(x,y)=|Re\{\tilde{I}_1(x,y)\}| \qquad (19)$$

or phase images according to $$\tilde{\varphi}_1(x,y) \sim \mathrm{atan}\left(\frac{Im\{\tilde{I}_1(x,y)\}}{Re\{\tilde{I}_1(x,y)\}}\right) \qquad (20)$$

FIG. 6 is a flowchart showing an example of how the phase maps $\hat{\phi}_{1a}(x,y)$ and $\hat{\phi}_{1b}(x,y)$ required in the equations (14) and (15) can be calculated from the acquired data.

For this purpose, in step Ia, first the raw data set $S_{1b}(k_x,k_y)$ of the first echo group is duplicated and then in step Ib the raw data set $S_{1b}(k_x,k_y)$ of the second echo group is duplicated.

Like in a conventional standard reconstruction, in step III.2a or III.2b, from one copy a respective complex image $S_{1b}(k_x,k_y)$ or $I_{1b}(x,y)$ is obtained with the aid of a two-dimensional complex Fourier transformation.

The other copy is filtered with a low pass in step IIa or IIb, respectively.) Subsequently, in step III.1a or III.1b, the filtered raw data sets $\hat{S}_{1a}(k_x,k_y)$ of the first echo group or $\hat{S}_{1b}(k_x,k_y)$ of the second echo group are transformed in the image space with a two-dimensional Fourier transformation, in order to obtain images with a lower spatial resolution $\hat{I}_{1a}(x,y)$ or $\hat{I}_{1b}(x,y)$.

The required phase maps $\hat{\phi}_{1a}(x,y)$ and $\hat{\phi}_{1b}(x,y)$ could now be directly calculated through phase extraction from the images with the lower spatial resolution according to $$\hat{I}_{1a}(x,y)=|\hat{I}_{1a}(x,y)|e^{i\hat{\phi}_{1a}(x,y)} \qquad (21)$$

and $$\hat{I}_{1b}(x,y)=|\hat{I}_{1b}(x,y)|e^{i\hat{\phi}_{1b}(x,y)} \qquad (22)$$

However, mathematically it is usually more advantageous to conjugate complexly each pixel of the images with the low spatial resolution $\hat{I}_{1a}(x,y)$ or $\hat{I}_{1b}(x,y)$ and to divide them by their amount. The correction maps thus obtained are then multiplied pixel by pixel in step IVa or IVb with the images with high spatial resolution $I_{1a}(x,y)$ or $I_{1b}(x,y)$, thus directly attaining from the equations (14) and (15) the phase corrected images $$\tilde{I}_{1a}(x,y) = I_{1a}(x,y)\frac{\hat{I}^*_{1a}(x,y)}{|\hat{I}_{1a}(x,y)|} \qquad (23)$$

or $$\tilde{I}_{1b}(x,y) = I_{1b}(x,y)\frac{\hat{I}^*_{1b}(x,y)}{|\hat{I}_{1b}(x,y)|} \qquad (24)$$

In step V, it is then possible to perform a complex addition according to equation (16), in order to attain the combined image $\tilde{I}_1(x,y)$ of the respective slice.

At this point, it should be added that in the context of the present patent application the term "complete raw data set" describes a data set with which it is possible to reconstruct an image according to prior art. Therefore, it includes data sets in which individual raw data lines, which are, for example, required for image reconstruction by means of fast Fourier transformation, were not acquired and have to be substituted, for example, with parallel reconstruction technologies.

Furthermore, a complete raw data set can be acquired with a single echo train, such as shown in FIGS. 3A and 3B, or with multiple repetition of the sequence shown in FIGS. 3A and 3B, wherein generally different k-lines are acquired with different repetitions. The first procedure corresponds to the so-called single shot variations HASTE or RARE in conventional turbo spin echo technology, the second the so-called multi shot variations with the respective advantages and disadvantages.

The inventive sequence is compatible with the most important non-Cartesian k-space trajectories known, for example, as "PROPELLER sequences", spiral sequences, sequences with concentric rings or radial sequences.

A PROPELLER sequence is a turbo spin echo sequence known from the article "Motion and Free-Breathing Cardiac Imaging" by James Pipe, published in the journal Magnetic Resonance in Medicine 42:963-969 (1999), which sequence acquires with each echo train a Cartesian k-space segment of a slice that involves the k-space center. A PROPELLER variation of the invention-based pulse sequence acquires with each echo train for each of the m simultaneously refocused slices two Cartesian k-space segments, each of which involves the k-space center. The k-space segments acquired in different echo trains are respectively rotated against one another about the k-space center.

Preferably, in a PROPELLER/BLADE variation, the above-mentioned complex combination of both echo groups is performed segment by segment. Here the term "segment" involves the data that are read after a single excitation pulse. In the PROPELLER/BLADE variation, each k-space segment represents a Cartesian sub-space by means of which the above-mentioned algorithm can be applied. The flow diagram shown in FIG. 7 displays the modified PROPELLER reconstruction for the first slice. The reconstruction for the other slices is performed in the same manner. At the same time, changes compared to a conventional PROPELLER reconstruction are respectively marked with a dash-dotted frame.

As in prior art, the different slices are reconstructed independently from one another. Therefore, the representation shows the reconstruction of a single slice. Contrary to prior art, part of the propeller blades of the slice are acquired twice in different echo groups. It is the goal of modified reconstruction to combine the doubly acquired propeller blades in the same direction according to a number of procedural steps with the result that, like in prior art, exactly one segment data set is available for each direction and the remaining procedural step can be performed in conventional manner.

Usually, a PROPELLER reconstruction starts with several procedural steps which, respectively, operate only based on the data of a segment.

If parallel reconstruction technology with several receiving coils has been used, the respective lines of the segment data set not acquired (for example, of the coil sensitivities of the single coils) are substituted in the procedural steps P.Ia, P.Ib. In the simplest case, this procedural step does not differ from the respective procedural step in conventional PROPELLER reconstruction. Optionally, the dual presence of the data set can be used advantageously, for example, for achieving an improved signal-to-noise ratio, for reducing remaining artifacts or for saving computing capacities.

Propeller blades of a specific slice with the same rotation angle, which are acquired twice in two scanning windows, can subsequently be combined in complex-valued manner in step P.III, after the slowly varying phase in the image space has been removed mathematically in steps P.IIa or P.IIb. For details of the procedural steps P.IIa, P.IIb and P.III, see the method described above by means of FIG. 6. The only difference is that the operations are performed on the bass of individual segment data sets and not on the complete doubly acquired k-space data set of a slice.

After the complex-valued combination of the doubly acquired propeller blades, for each direction a complete, phase-corrected propeller blade segment data set $B_{1x}$ is available for each adjustment (rotation angle of the propeller blade). Consequently, the remaining procedural steps can be performed in the manner. of conventional PROPELLER reconstruction. Here, these remaining procedural steps comprise an optional motion detection (step P.IV), a density compensation (for example, in step P.V) and finally a combination of propeller blades with different adjustment in the k-space, a final two-dimensional Fourier transformation in the image space and further optional steps, for example, filter operations (all steps represented mutually by the block step P.VI). Usually, the combination of the propeller blades with different adjustment is implemented as so-called "gridding" operation. Optionally, as described in DE 10 2005 046 732, this step can also be implemented as rotation with subsequent accumulation. Details of conventional PROPELLER reconstruction are included in the above-mentioned journal article by James Pipe.

Density compensation is advantageous because the central regions of the k-space are repeatedly acquired by different propeller blades, while the peripheral regions are usually acquired only once.

The subsequent description includes further preferred embodiments.

In turbo spin echo imaging, short echo spacing usually has a positive effect on the image quality. In the invention-based method, the number of scanning windows per refocusing pulse has been increased by 2 m compared to a conventional one-slice turbo spin echo sequence which (as shown in FIG. 2) has only one scanning window per refocusing pulse. In order to be still able to realize short echo spacing, it is preferred to use the invention-based pulse sequence with a large readout gradient so as to traverse in readout direction the k-space to be acquired in the shortest period possible.

However, the maximum gradient amplitude $A_{max}$ is technically limited by the gradient system of the magnetic resonance system. Furthermore, in the invention-based pulse sequence, in the period $T_\alpha$ between two consecutive slice excitation pulses $\alpha_1$, $\alpha_2$, the same gradient moment $C=T_\alpha \times A_{GRO}$ as between two consecutive echo signals has to be switched in readout direction. However, the time available for this process is shorter by the duration of a slice excitation pulse $\alpha_1$, $\alpha_2$, than the time period $T_\alpha$. Consequently, the maximum readout gradient is always lower than the maximum amplitude $A_{max}$ of the gradient system and can be selected the closer to the maximum amplitude $A_{max}$ the shorter the duration of an excitation pulse $\alpha_1$, $\alpha_2$. Therefore, in a preferred embodiment, in consideration of the maximum $B_1$ amplitude to be realized by the radio-frequency transmission system of the magnetic resonance imaging system and in consideration of SAR limitations, the duration of a slice excitation pulse $\alpha_1$, $\alpha_2$ is selected to be as short as possible. Because of the fact that the tilting angle of 90° to be implemented by an excitation pulse $\alpha_1$, $\alpha_2$ usually is smaller than the tilting angle of a refocusing pulse $\beta$, $\gamma$, $\delta$, $\epsilon$, $\zeta$, it is usually possible, when a maximum $_{B1}$ amplitude is supplied, to select the duration of an excitation pulse $\alpha_1$, $\alpha_2$ particularly shorter than the duration of a refocusing pulse $\beta$, $\gamma$, $\delta$, $\epsilon$, $\zeta$.

In conclusion, it should be noted that the previously described detailed methods and designs involve embodiments and the basic principle can be applied by an expert in a variety of areas without leaving the range of the invention to the extent provided by the claims.

For example, by means of a sequence of readout gradients with alternating amplitude, such as an EPI sequence, it is possible to form several echoes per echo group and these, like in a GRASE method (gradient and spin echo method, as described in "GRASE (Gradient and Spin Echo) Imaging: A Novel Fast MRI technique"; Magnetic Resonance in Medicine, 20, 1991, pp. 344-349), separately encode phases for a reduction of acquisition time. Alternatively, the temporal interval of the readout gradient of an echo group can be selected in such a way that it is possible to achieve a desired phase shifting between water and fat components of the read signal. From the different images of an echo group thus obtained, it is possible with the aid of so-called Dixon reconstruction to reconstruct images which respectively represent only the fat components or only the water components of the tissue to be examined.

The inventive pulse sequences are able to maintain a sufficiently long echo train for fast T2-weighted imaging even when flip angle of the refocusing pulses is significantly reduced compared toward 180°. This is especially advantageous when used in high-field systems with a basic magnetic field of 3 tesla or more in order to achieve an adequate reduction of SAR exposure with a moderate slice number m (and thus a moderate extension of echo spacing). Therefore, for SAR reduction, the inventive sequence is often preferably used with reduced flip angles of the refocusing pulses. Although all refocusing pulses in the figures are displayed in the same manner, in particular different refocusing pulses can also have different flip angles, for example, $\beta$=180°, $\gamma$=120°, $\delta$=120°, . . . .

The sequence is also compatible with so-called variable rate (VR) or variable rate selective excitation (VERSE) pulses by means of which it is possible to achieve a reduction of the radiated RF power by reducing the peak amplitude of the radio-frequency pulses compared to a respective SINC pulse.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring magnetic resonance (MR) data from an examination subject, comprising:
    operating an MR data acquisition unit, in which a subject is situated, according to a pulse sequence module in which a plurality of spatially selective radio-frequency (RF) slice excitation pulses are radiated that respectively excite nuclear spins in a plurality of respective slices in the examination subject, whereby the time between two consecutive of these RF slice excitation pulses defines a first time interval;
    operating said MR data acquisition unit in said sequence module to execute a preparation block following a last of said plurality of RF slice excitation pulses and, in said preparation block, radiating at least one RF refocusing pulse that causes each of the excited slices to produce one respective echo signal, with a time interval of two consecutive ones of said echo signals equaling said first time interval;
    operating said MR data acquisition unit to radiate a second RF refocusing pulse at a time interval after a last of said echo signals produced by said preparation block, and configuring said second RF refocusing pulse to cause each of the excited slices to produce one further echo signal, with a time interval between two consecutive ones of said further echo signals equaling said first time interval;
    operating said MR data acquisition unit to radiate at least one further RF refocusing pulse at a third time interval after a respective preceding RF refocusing pulse, and configuring said at least one further RF refocusing pulse to cause the excited slices to produce a plurality of temporally separated echo signals for each further RF refocusing pulse, and setting a duration of said third time interval to cause the plurality of echo signals caused by each further RF refocusing pulse to be twice as high as said plurality of excited slices; and
    operating said MR data acquisition unit to readout raw data representing each of said echo signals and entering said raw data into an electronic memory organized as k-space, thereby producing an electronic memory filled with data in a form allowing reconstruction of images of said plurality of slices of the subject.

2. A method as claimed in claim 1 comprising operating said MR data acquisition unit to activate gradient pulses in slice selection direction between consecutive RF slice excitation pulses such that the total accumulated moment in slice selection direction between two consecutive ones of said RF slice excitation pulses is zero.

3. A method as claimed in claim 1 comprising reading out said plurality of echo signals for each RF refocusing pulse by operating said MR data acquisition unit to activate a readout gradient pulse during the reading out of each of said echo signals and an additional gradient pulse in a readout direction between two consecutive ones of said RF slice excitation pulses, with the total gradient moment of said additional readout gradient pulse having an absolute value equal to a gradient moment accumulated between two consecutive ones of said echo signals by their respective readout gradient pulses.

4. A method as claimed in claim 3, comprising:
    operating said MR data acquisition unit to activate another gradient pulse in said readout direction between said last of said RF slice excitation pulses and said preparation block, such that said another gradient pulse exactly compensates the gradient moment in readout direction that is accumulated by nuclear spins in the slice that was excited by said last of said RF slice excitation pulses, between a start of the preparation block and the first echo signal produced after said preparation block by said last of said RF slice excitation pulses and said preparation block; and
    operating said MR data acquisition unit to activate another gradient pulse in said readout direction between a last echo signal produced by said preparation block, said another gradient pulse exactly compensating the moment in the readout direction that is accumulated by nuclear spins excited in a slice by a first of said RF slice excitation pulses, between said second RF refocusing pulse and the first echo signal of said slice excited by said first of said RF slice excitation pulses produced after said second RF refocusing pulse.

5. A method as claimed in claim 1 comprising operating said MR data acquisition unit to radiate each of said RF slice excitation pulses for a duration that is shorter than a duration at which any of said RF refocusing pulses is radiated.

6. A method as claimed in claim 1 comprising operating said MR data acquisition unit with said preparation block configured to attenuate transverse magnetization of said nuclear spins in a region of the subject from which the echo signals in said preparation block originate, dependent on diffusion properties of said tissue.

7. A method as claimed in claim 1 comprising entering said raw data into said electronic memory organized as k-space by, for each of said slices, acquiring said raw data twice with a single echo train in said sequence module and entering the twice-acquired raw data into a respective k-space region of said electronic memory for the respective slice.

8. A method as claimed in claim 1 comprising operating said MR data acquisition unit to acquire said raw data in a pulse sequence comprising a plurality of sequence modules, each identical to said sequence module and entering raw data into two segments of said k-space for each slice acquired with an echo train in each of said sequence modules.

9. A method as claimed in claim 8 comprising entering said raw data into k-space by segmenting k-space according to a PROPELLER trajectory.

10. A method for producing magnetic resonance image data of an examination subject, comprising:
    operating an MR data acquisition unit, in which a subject is situated, according to a pulse sequence module in which a plurality of spatially selective radio-frequency (RF) slice excitation pulses are radiated that respectively excite nuclear spins in a plurality of respective slices in the examination subject, whereby the time between two consecutive of these RF slice excitation pulses defines a first time interval;
    operating said MR data acquisition unit in said sequence module to execute a preparation block following a last of said plurality of RF slice excitation pulses and, in said preparation block, radiating at least one RF refocusing pulse that causes each of the excited slices to produce one respective echo signal, with a time interval between two consecutive ones of said echo signals equaling said first time interval;

operating said MR data acquisition unit to radiate a second RF refocusing pulse at a time interval after a last of said echo signals produced by said preparation block, and configuring said second RF refocusing pulse to cause each of the excited layers to produce one further echo signal, with a time interval between two consecutive ones of said further echo signals equaling said first time interval;

operating said MR data acquisition unit to radiate at least one further RF refocusing pulse at a third time interval after a respective preceding RF refocusing pulse, and configuring said at least one further RF refocusing pulse to cause the excited slices to produce a plurality of temporally separated echo signals for each further RF refocusing pulse, and setting a duration of said third time interval to cause the plurality of echo signals caused by each further RF refocusing pulse to be twice as high as said plurality of excited slices;

operating said MR data acquisition unit to readout raw data during a scanning window around each of said echo signals and entering said raw data into an electronic memory organized as k-space, thereby producing an electronic memory filled with data in a form allowing reconstruction of images of said plurality of slices of the subject;

from a processor, accessing said raw data in said electronic memory and operating on said raw data in said processor according to an image reconstruction algorithm to calculate a plurality of separate magnitude images from the raw data acquired during each of said scanning windows; and in said processor, combining the respective magnitude images from each slice to form a single MR image for that slice, and making said magnitude image for each slice available at an output of said processor in electronic form.

11. A method as claimed in claim 10 comprising combining said magnitude images by executing a sum of squares algorithm in said processor.

12. A method for producing magnetic resonance image data of an examination subject, comprising:

operating an MR data acquisition unit, in which a subject is situated, according to a pulse sequence module in which a plurality of spatially selective radio-frequency (RF) slice excitation pulses are radiated that respectively excite nuclear spins in a plurality of respective slices in the examination subject, whereby the time between two consecutive of these RF slice excitation pulses defines a first time interval;

operating said MR data acquisition unit in said sequence module to execute a preparation block following a last of said plurality of RF slice excitation pulses and, in said preparation block, radiating at least one RF refocusing pulse that causes each of the excited slices to produce one respective echo signal, with a time interval between two consecutive ones of said echo signals equaling said first time interval;

operating said MR data acquisition unit to radiate a second RF refocusing pulse at a time interval after a last of said echo signals produced by said preparation block, and configuring said second RF refocusing pulse to cause each of the excited layers to produce one further echo signal, with a time interval between two consecutive ones of said further echo signals equaling said first time interval;

operating said MR data acquisition unit to radiate at least one further RF refocusing pulse at a third time interval after a respective preceding RF refocusing pulse, and configuring said at least one further RF refocusing pulse to cause the excited slices to produce a plurality of temporally separated echo signals for each further RF refocusing pulse, and setting a duration of said third time interval to cause the plurality of echo signals caused by each further RF refocusing pulse to be twice as high as said plurality of excited slices;

operating said MR data acquisition unit to readout raw data during a scanning window around each of said echo signals and entering said raw data into an electronic memory organized as k-space, thereby producing an electronic memory filled with data in a form allowing reconstruction of images of said plurality of slices of the subject; and from a processor, accessing said raw data from said electronic memory and generating an MR image therefrom by executing an algorithm in said processor in which image data for a respective slice are formed as a complex-valued combination of raw data acquired for that slice in different ones of said scanning windows.

13. A method as claimed in claim 12 comprising, before implementing said complex-valued combination, computationally removing any spatially slowly changing phase in the image domain from said image data.

14. A computerized control device for operating a magnetic resonance (MR) data acquisition unit in which an examination subject is situated, said control device being configured to:

operate said MR data acquisition unit, in which a subject is situated, according to a pulse sequence module in which a plurality of spatially selective radio-frequency (RF) slice excitation pulses are radiated that respectively excite nuclear spins in a plurality of respective slices in the examination subject, whereby the time between two consecutive of these RF slice excitation pulses defines a first time interval;

operate said MR data acquisition unit in said sequence module to execute a preparation block following a last of said plurality of RF slice excitation pulses and, in said preparation block, radiating at least one RF refocusing pulse that causes each of the excited slices to produce one respective echo signal, with a time interval of two consecutive ones of said echo signals equaling said first time interval;

operate said MR data acquisition unit to radiate a second RF refocusing pulse at a time interval after a last of said echo signals produced by said preparation block, and configure said second RF refocusing pulse to cause each of the excited layers to produce one further echo signal, with a time interval between two consecutive ones of said further echo signals equaling said first time interval;

operate said MR data acquisition unit to radiate at least one further RF refocusing pulse at a third time interval after a respective preceding RF refocusing pulse, and configure said at least one further RF refocusing pulse to cause the excited slices to produce a plurality of temporally separated echo signals for each further RF refocusing pulse, and setting a duration of said third time interval to cause the plurality of echo signals caused by each further RF refocusing pulse to be twice as high as said plurality of excited slices; and operate said MR data acquisition unit to readout raw data during a scanning window around each of said echo signals and to enter said raw data into an electronic memory organized as k-space, thereby producing an electronic memory filled with data in a form allowing reconstruction of an images of said plurality of slices of the subject.

15. A magnetic resonance (MR) imaging apparatus comprising:
- an MR data acquisition unit comprising a basic field magnet that generates a basic field in which an examination subject in the MR data acquisition unit i situated, a radio-frequency (RF) transmission system, a gradient system, an RF reception system, and a control unit;
- said control unit being configured to operate said MR data acquisition unit, in which a subject is situated, according to a pulse sequence module in which a plurality of spatially selective RF slice excitation pulses are radiated by said RF transmission system that respectively excite nuclear spins in a plurality of respective slices in the examination subject, whereby the time between two consecutive of these RF slice excitation pulses defines a first time interval;
- said control unit being configured to operate said MR data acquisition unit in said sequence module to execute a preparation block following a last of said plurality of RF slice excitation pulses and, in said preparation block, radiating at least one RF refocusing pulse by said RF transmission system that causes each of the excited slices to produce one respective echo signal, with a time interval of two consecutive ones of said echo signals equaling said first time interval;
- said control unit being configured to operate said MR data acquisition unit to radiate a second RF refocusing pulse by said RF transmission system at a time interval after a last of said echo signals produced by said preparation block, with said second RF refocusing pulse being configured to cause each of the excited slices to produce one further echo signal, with a time interval between two consecutive ones of said further echo signals equaling said first time interval;
- said control unit being configured to operate said MR data acquisition unit to radiate at least one further RF refocusing pulse by said RF transmission system at a third time interval after a respective preceding RF refocusing pulse, and with said at least one further RF refocusing pulse being configured to cause the excited slices to produce a plurality of temporally separated echo signals for each further RF refocusing pulse, and to set a duration of said third time interval to cause the plurality of echo signals caused by each further RF refocusing pulse to be twice as high as said plurality of excited slices; and
- said control unit being configured to operate said gradient system of said MR data acquisition unit to execute a readout gradient during the readout of raw data to spatially encode said raw data, and to enter said raw data into an electronic memory organized as k-space, thereby producing an electronic memory filled with data in a form allowing reconstruction of images of said plurality of slices of the subject.

16. A non-transitory, computer-readable data storage medium encoded with programming instructions, said data storage medium being loaded into a control and evaluation system of a magnetic resonance (MR) apparatus that also comprises an MR data acquisition unit, said programming instructions causing said control and evaluation system to:
- operate said MR data acquisition unit, in which a subject is situated, according to a pulse sequence module in which a plurality of spatially selective radio-frequency (RF) slice excitation pulses are radiated that respectively excite nuclear spins in a plurality of respective slices in the examination subject, whereby the time between two consecutive of these RF slice excitation pulses defines a first time interval;
- operate said MR data acquisition unit in said sequence module to execute a preparation block following a last of said plurality of RF slice excitation pulses and, in said preparation block, radiating at least one RF refocusing pulse that causes each of the excited slices to produce one respective echo signal, with a time interval of two consecutive ones of said echo signals equaling said first time interval;
- operate said MR data acquisition unit to radiate a second RF refocusing pulse at a time interval after a last of said echo signals produced by said preparation block, with said second RF refocusing pulse being configured to cause each of the excited slices to produce one further echo signal, with a time interval between two consecutive ones of said further echo signals equaling said first time interval;
- operate said MR data acquisition unit to radiate at least one further RF refocusing pulse at a third time interval after a respective preceding RF refocusing pulse, with said at least one further RF refocusing pulse being configured to cause the excited slices to produce a plurality of temporally separated echo signals for each further RF refocusing pulse, and set a duration of said third time interval to cause the plurality of echo signals caused by each further RF refocusing pulse to be twice as high as said plurality of excited slices; and
- operate said MR data acquisition unit to readout raw data during a scanning window around each of said echo signals, and enter said raw data into an electronic memory organized as k-space, thereby producing an electronic memory filled with data in a form allowing reconstruction of images of said plurality of slices of the subject.

* * * * *